United States Patent
Shan et al.

Patent Number: 6,113,731
Date of Patent: Sep. 5, 2000

[54] MAGNETICALLY-ENHANCED PLASMA CHAMBER WITH NON-UNIFORM MAGNETIC FIELD

[75] Inventors: Hongching Shan, San Jose; Roger Lindley, Santa Clara; Claes Bjorkman, Mountain View; Xue Yu Qian, Milpitas, all of Calif.; Richard Plavidal, La Grangeville, N.Y.; Bryan Pu, San Jose, Calif.; Ji Ding, Newark, Calif.; Zongyu Li, Sunnyvale, Calif.; Kuang-Han Ke, Mountain View, Calif.; Michael Welch, Livermore, Calif.

[73] Assignee: Applied Materials, Inc., Santa Clara, Calif.

[21] Appl. No.: 08/735,444

[22] Filed: Jan. 2, 1997

[51] Int. Cl.$^7$ .................................................. C23F 1/02
[52] U.S. Cl. ................................. 156/345; 118/723 MA; 315/111.41
[58] Field of Search ...................... 118/723 R, 723 MR, 118/723 MA; 156/345; 204/298.16, 298.37; 438/728, 732, 758; 315/111.41; 216/70, 67; 427/571

[56] References Cited

U.S. PATENT DOCUMENTS

| | | | |
|---|---|---|---|
| 4,631,106 | 12/1986 | Nakazato et al. | 156/345 |
| 4,668,338 | 5/1987 | Maydan et al. | 156/643 |
| 4,668,365 | 5/1987 | Foster et al. | 204/192.23 |

(List continued on next page.)

FOREIGN PATENT DOCUMENTS

| | | |
|---|---|---|
| 0 223 975 | 3/1987 | European Pat. Off. ......... H01J 37/34 |
| 0 665 575 | 2/1995 | European Pat. Off. . |
| 63-186429 | 8/1988 | Japan . |
| 3-190127 | 8/1991 | Japan . |
| 3-224227 | 10/1991 | Japan . |

OTHER PUBLICATIONS

H. Shan et al., "Process kit and wafer temperature effects on dielectric etch rate and uniformity of electrostatic chuck," Third International Workshop on Advanced Plasma Tools: Sources, Process Control and Diagnostics, May 4, 1995.

S. Fang & McVittie, "Model and experiments for thin oxide damage from wafer charging in magnetron plasmas," IEEE Electron Device Letters, vol. 13, No. 6, pp. 347–349, Jun. 1992.

S. Fang & McVittie, "Role of 'antenna' structure on thin oxide damage from plasma induced wafer charging," Mat. Res. Soc. Symp. Proc., vol. 265, pp. 231–236, 1992.

(List continued on next page.)

Primary Examiner—Thi Dang
Assistant Examiner—Luz Alejandro
Attorney, Agent, or Firm—Robert Stern

[57] ABSTRACT

A plasma chamber having a magnet which produces a magnetic field such that, within a region parallel to and adjacent to the workpiece, the direction of the magnetic field is approximately the vector cross product of (i) the gradient of the magnitude of the magnetic field, and (ii) a vector extending perpendicularly from the workpiece surface toward the plasma. Alternatively, the plasma chamber includes a north magnetic pole and a south magnetic pole located at distinct azimuths around the periphery of the workpiece. The azimuth of the south magnetic pole relative to the north magnetic pole is clockwise around the central axis, and each magnetic pole faces a direction which is more toward than away from a central axis of the workpiece area. An additional aspect of the invention is a plasma chamber having a rotating magnetic field produced by electromagnets spaced around the periphery of the workpiece which receive successive fixed amounts of electrical current during successive time intervals. During each transition between the time intervals, the current supplied to each electromagnet is changed relatively slowly or relatively quickly according to whether the current change includes a change in polarity.

42 Claims, 15 Drawing Sheets

U.S. PATENT DOCUMENTS

| | | | |
|---|---|---|---|
| 4,767,641 | 8/1988 | Kieser et al. | 427/38 |
| 4,829,215 | 5/1989 | Kim et al. | 315/111.41 |
| 5,074,456 | 12/1991 | Degner et al. | 228/121 |
| 5,213,658 | 5/1993 | Ishida | 156/643 |
| 5,215,619 | 6/1993 | Cheng et al. | 156/345 |
| 5,225,024 | 7/1993 | Hanley et al. | 156/345 |
| 5,252,178 | 10/1993 | Moslehi | 156/643 |
| 5,271,788 | 12/1993 | Hasegawa et al. | 156/345 |
| 5,292,399 | 3/1994 | Lee et al. | 156/643 |
| 5,298,465 | 3/1994 | Levy | 437/225 |
| 5,308,417 | 5/1994 | Groechel et al. | 156/643 |
| 5,320,704 | 6/1994 | Horioka et al. | 156/626 |
| 5,330,607 | 7/1994 | Nowicki | 156/345 |
| 5,423,918 | 6/1995 | Gupta et al. | 134/1 |
| 5,440,206 | 8/1995 | Kurono et al. | 315/111.41 |
| 5,444,207 | 8/1995 | Sekine et al. | 219/121.43 |
| 5,449,977 | 9/1995 | Nakagawa et al. | 315/111.51 |
| 5,474,649 | 12/1995 | Kava et al. | 156/643.1 |
| 5,484,486 | 1/1996 | Blackburn et al. | 118/728 |
| 5,534,108 | 7/1996 | Qian et al. | 156/643.1 |
| 5,552,124 | 9/1996 | Su | 156/345 |
| 5,556,501 | 9/1996 | Collins et al. | 156/345 |
| 5,565,738 | 10/1996 | Samukawa et al. | 315/111.51 |
| 5,573,596 | 11/1996 | Yin . | |
| 5,673,922 | 10/1997 | Sherstinsky et al. | 279/133 |
| 5,685,914 | 11/1997 | Hills et al. | 118/723 E |
| 5,740,009 | 4/1998 | Pu et al. . | |

OTHER PUBLICATIONS

S. Fang & McVittie, "Charging damage to gate oxides in $O_2$ magnetron plasma," J. Appl. Phys., vol. 72, No. 10, pp. 4865–4872, Nov. 1992.

H. Shin et al., "Plasma etching charge–up damage to thin oxides," Solid State Technology, Aug. 1993, pp. 29–36.

S. Nakagawa et al., "Charge build–up and uniformity control in magnetically enhanced reactive ion etching using a curved lateral magnetic field", Jpn. J. Appl. Phys., vol. 33, part 1, No. 4B, pp. 2194–2199 (1994).

H. Shan et al., "Process kit and wafer temperature effects on dielectric etch rate and uniformity of electrostatic chuck", J. Vac. Sci. Tech. B, vol. 14, No. 1, Jan./Feb. 1996, pp. 521–526.

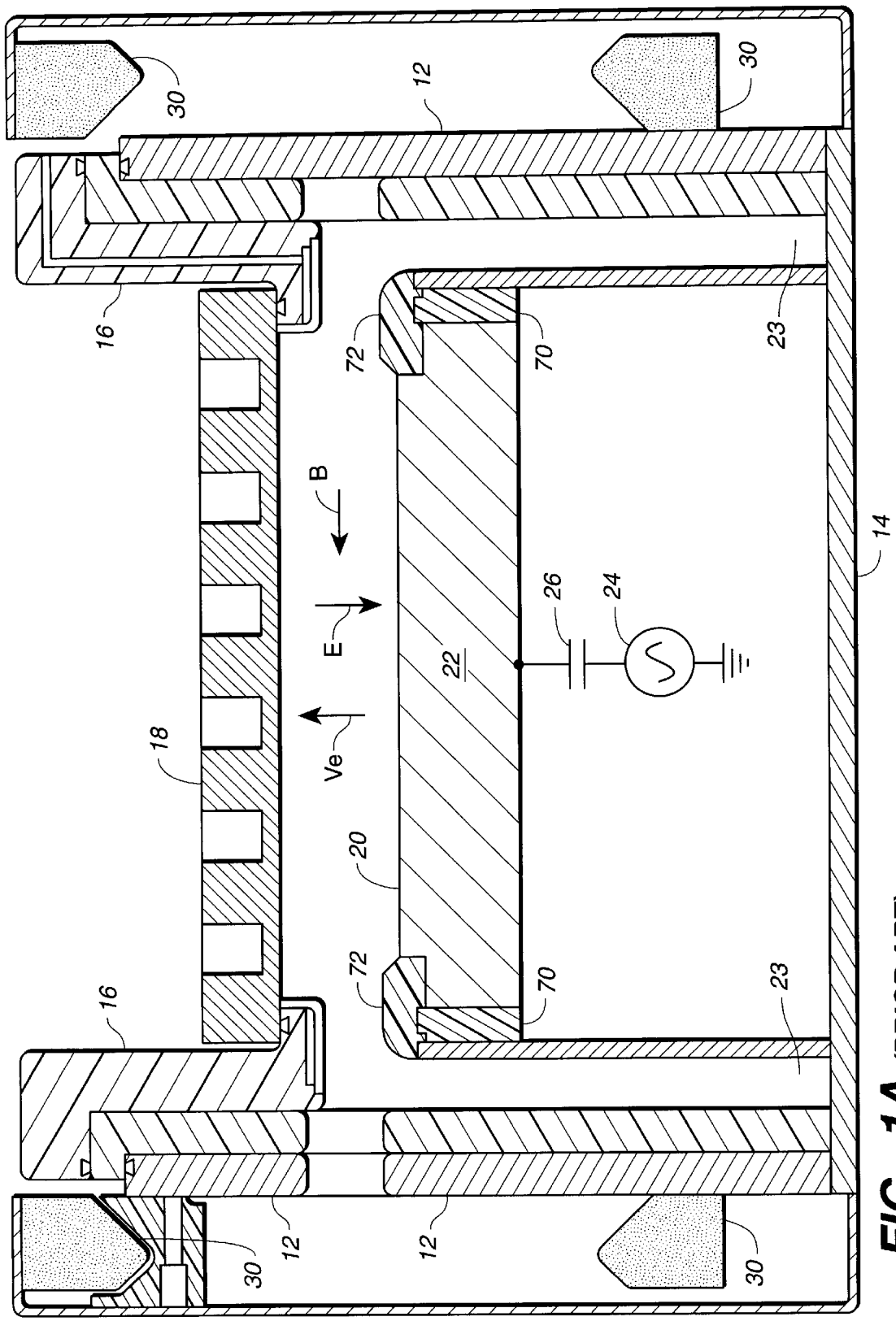
FIG._1A (PRIOR ART)

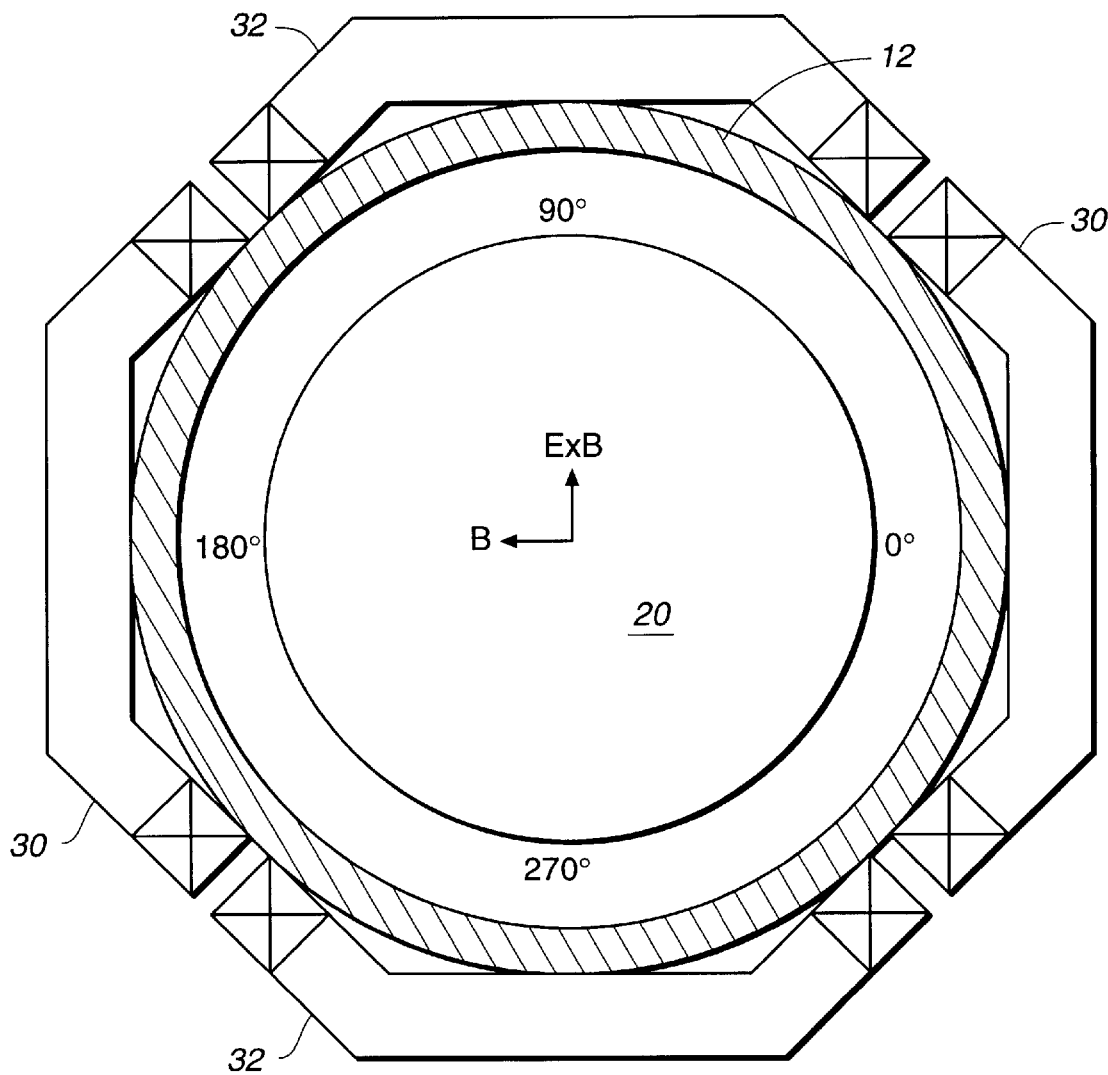
FIG._1B *(PRIOR ART)*

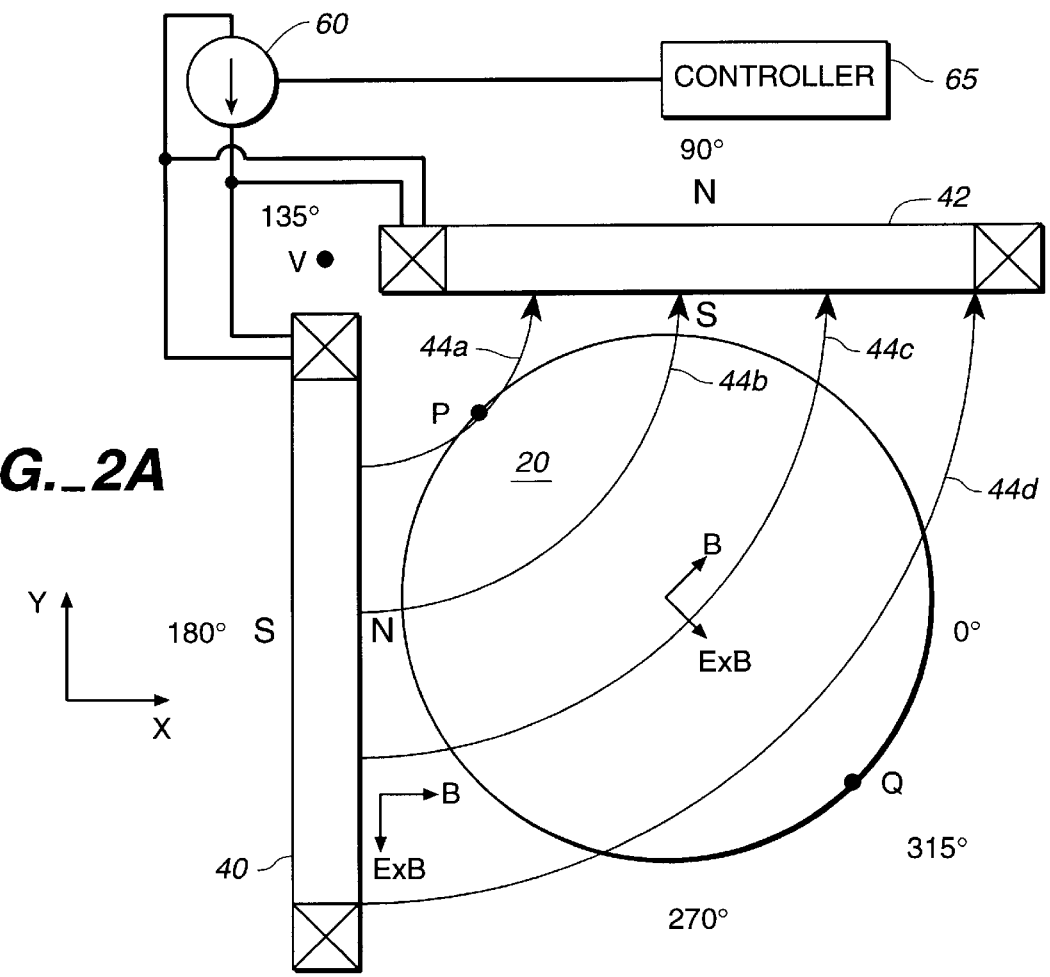
FIG._2A
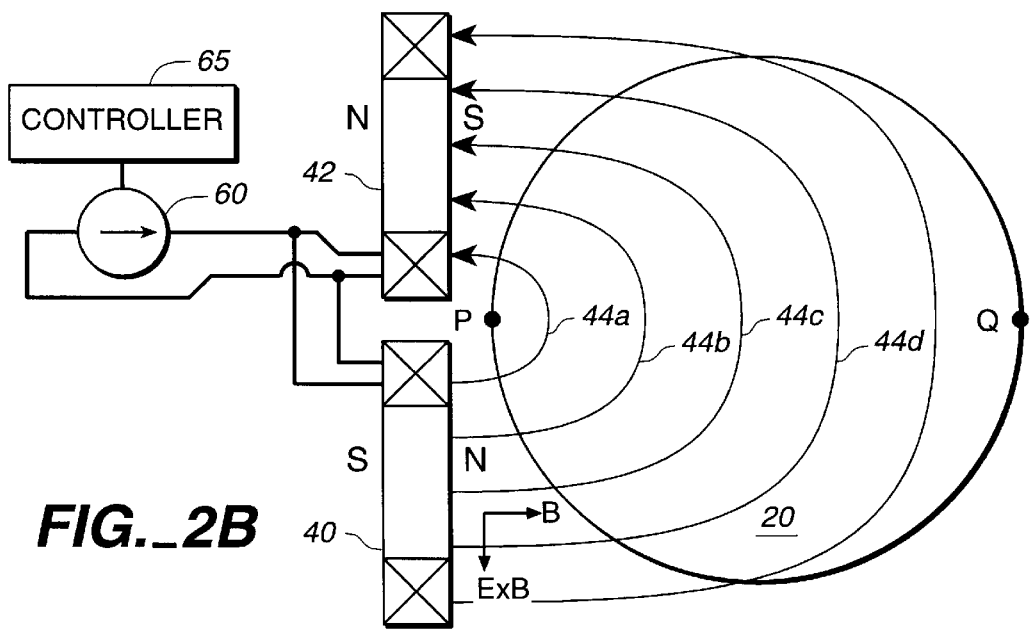
FIG._2B

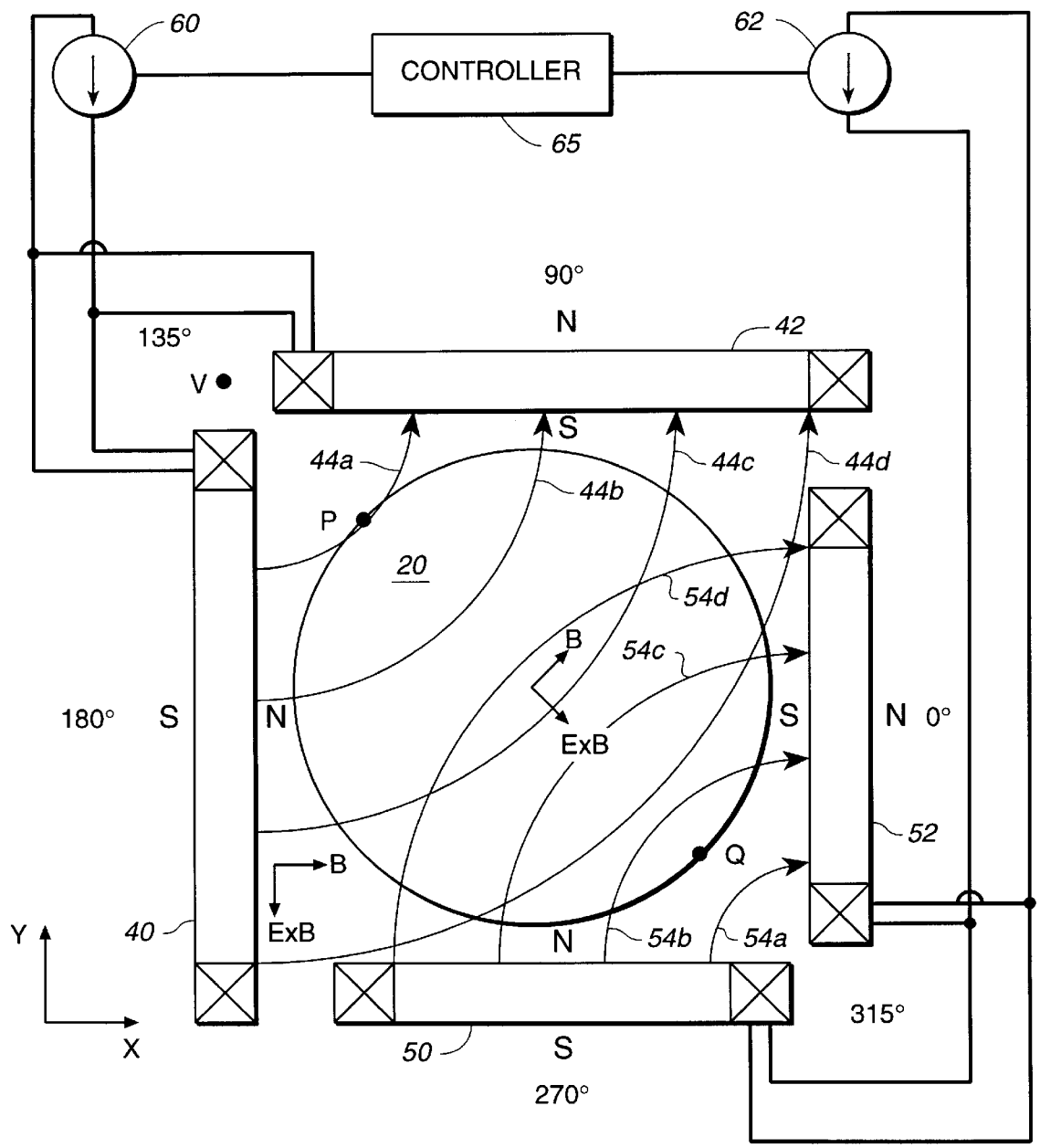
FIG._3A

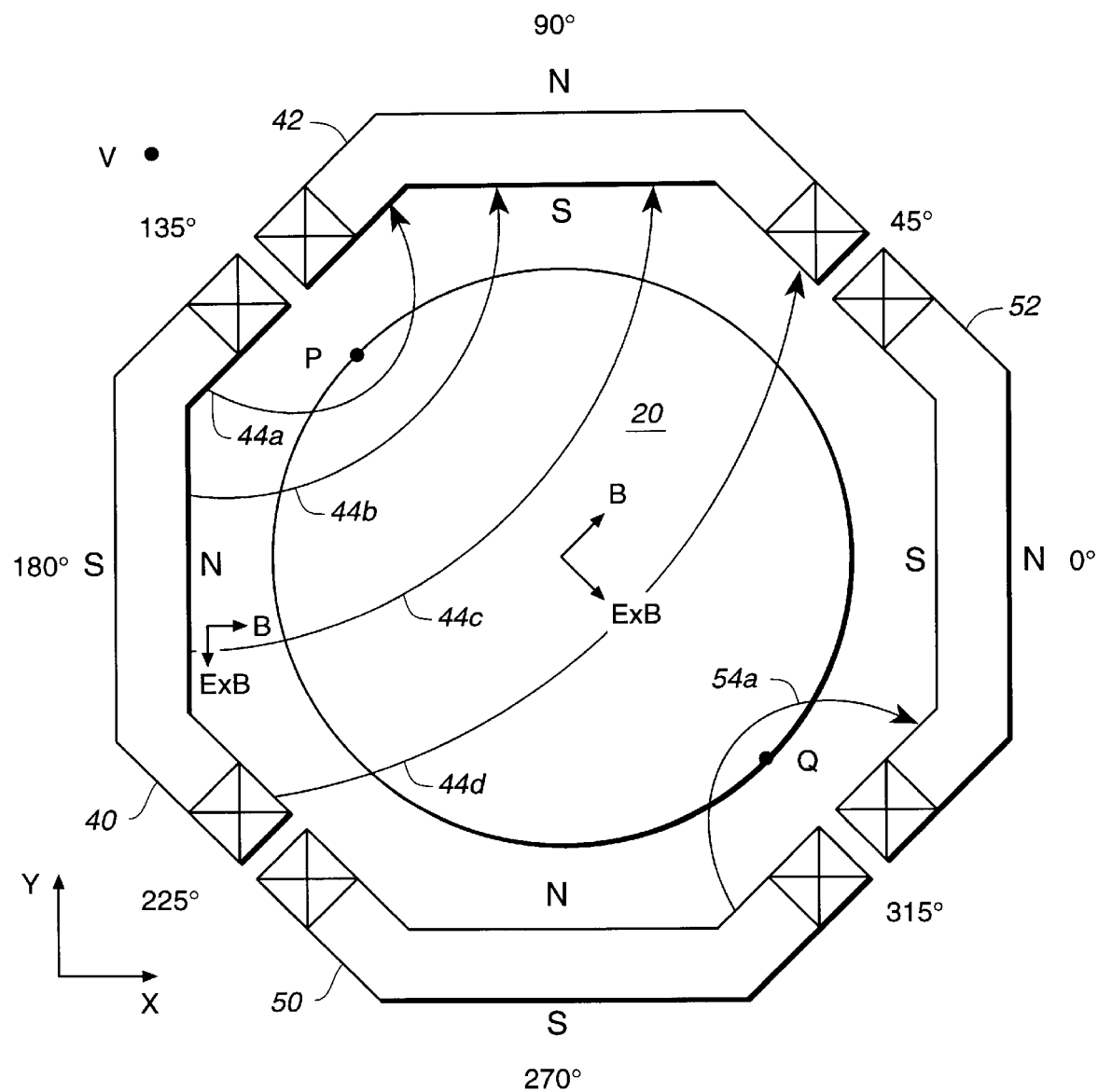
FIG._3B

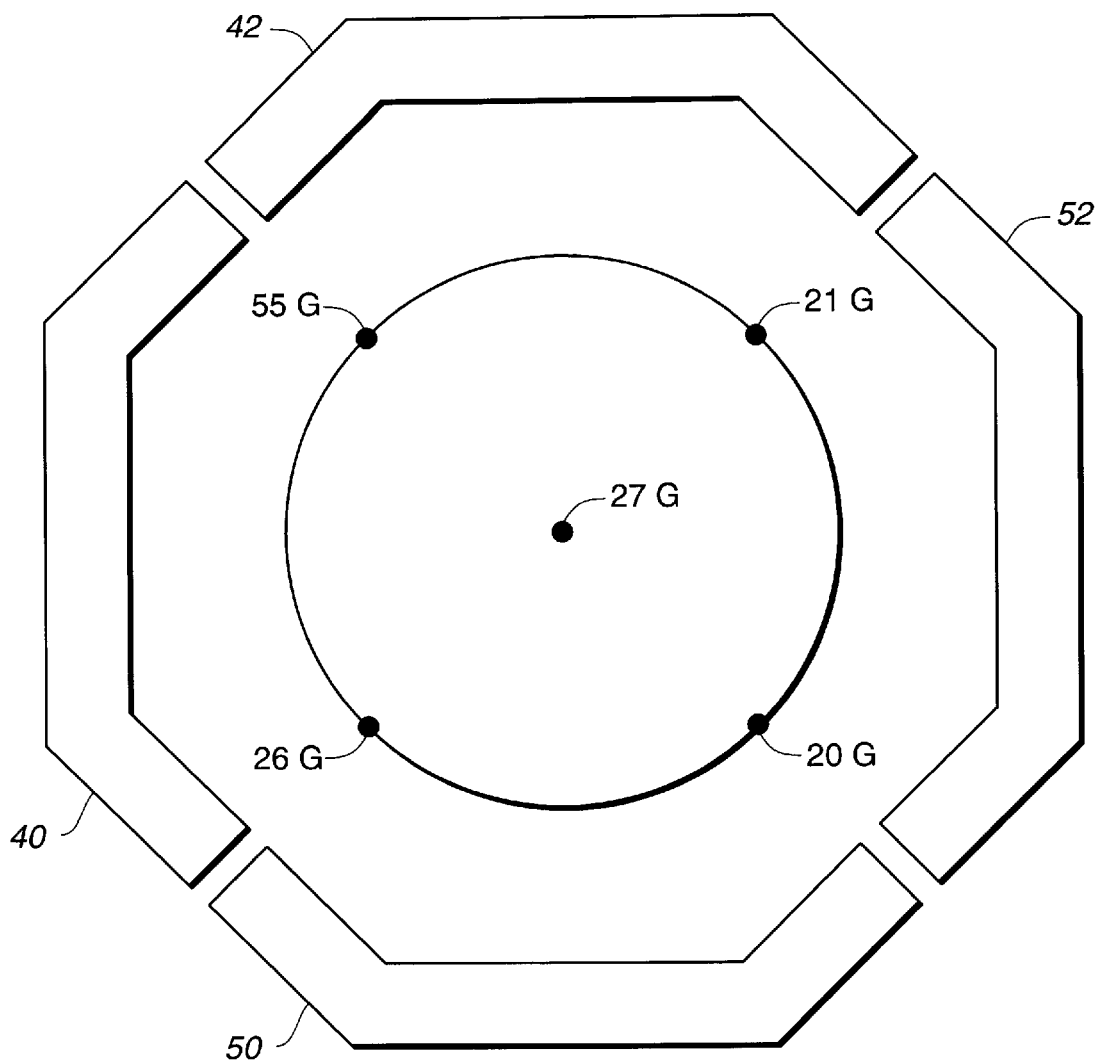
FIG._4

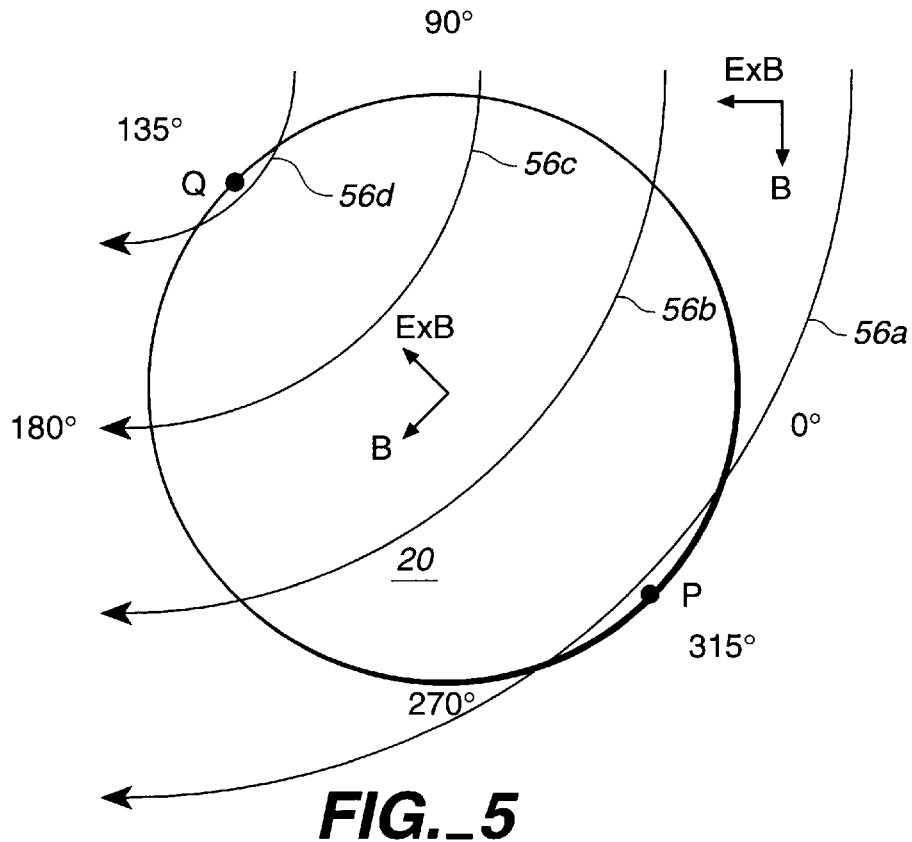
FIG._5
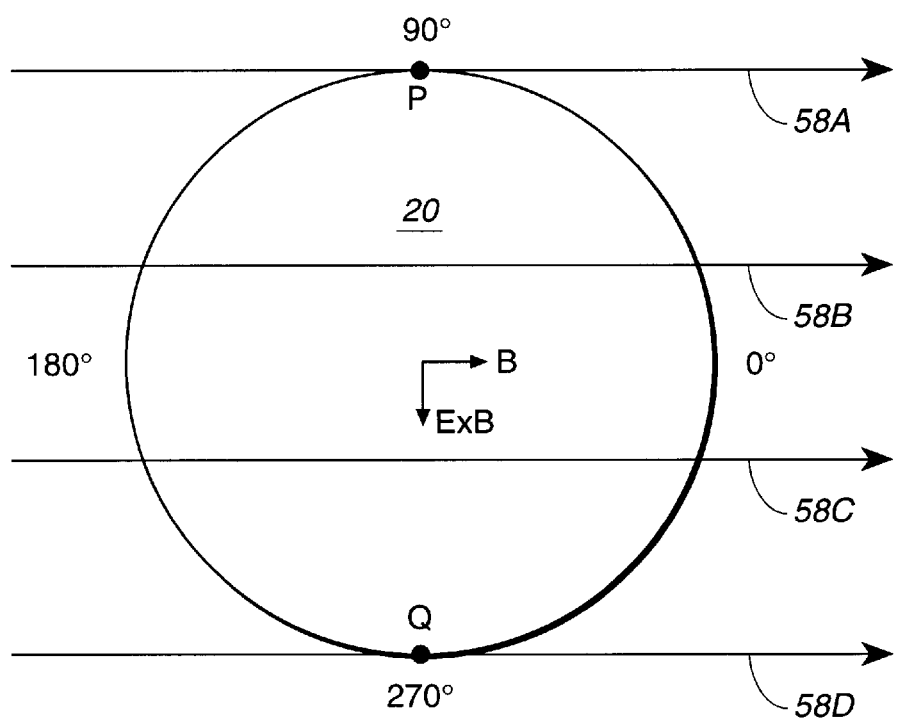
FIG._6

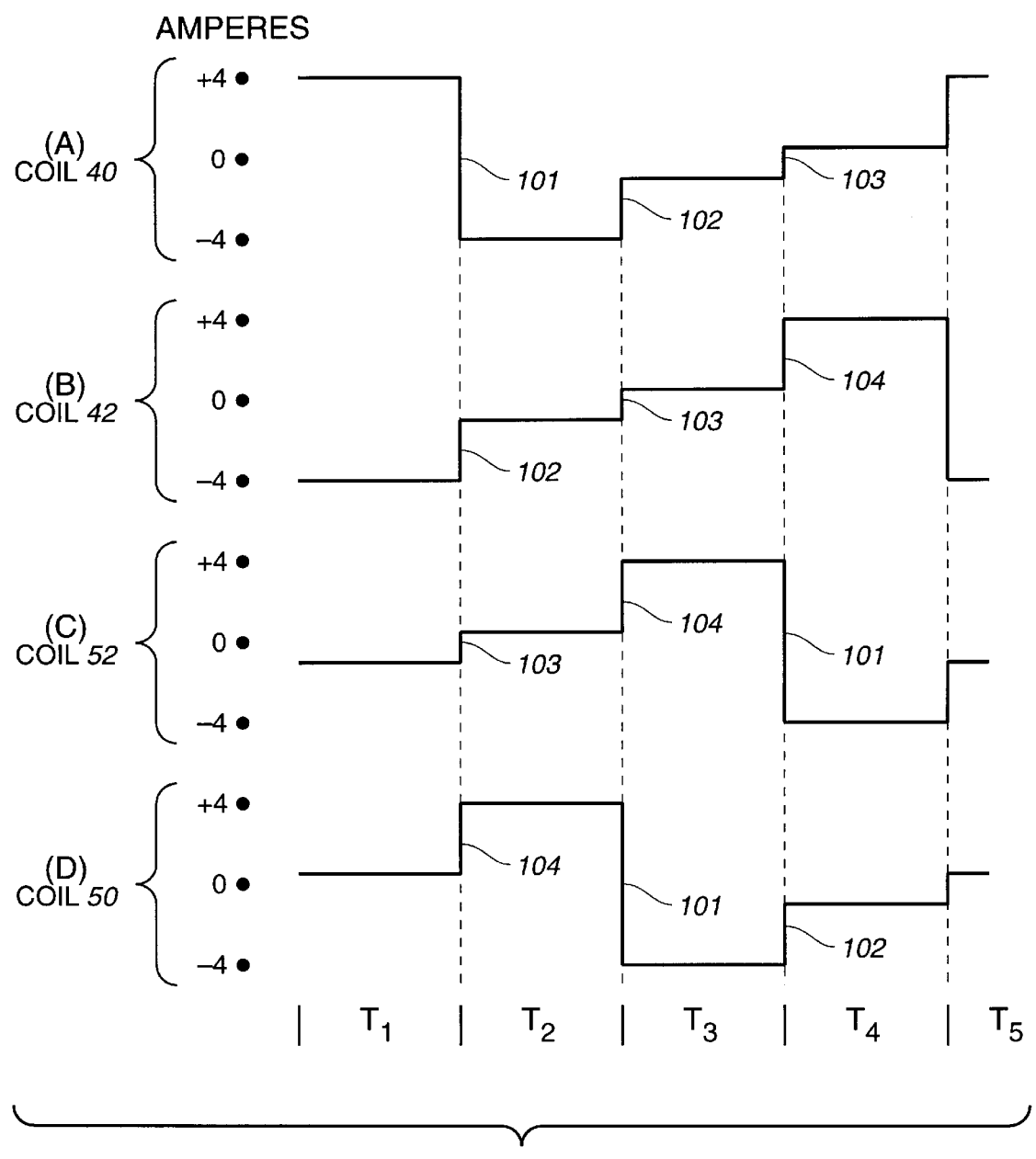
FIG._7

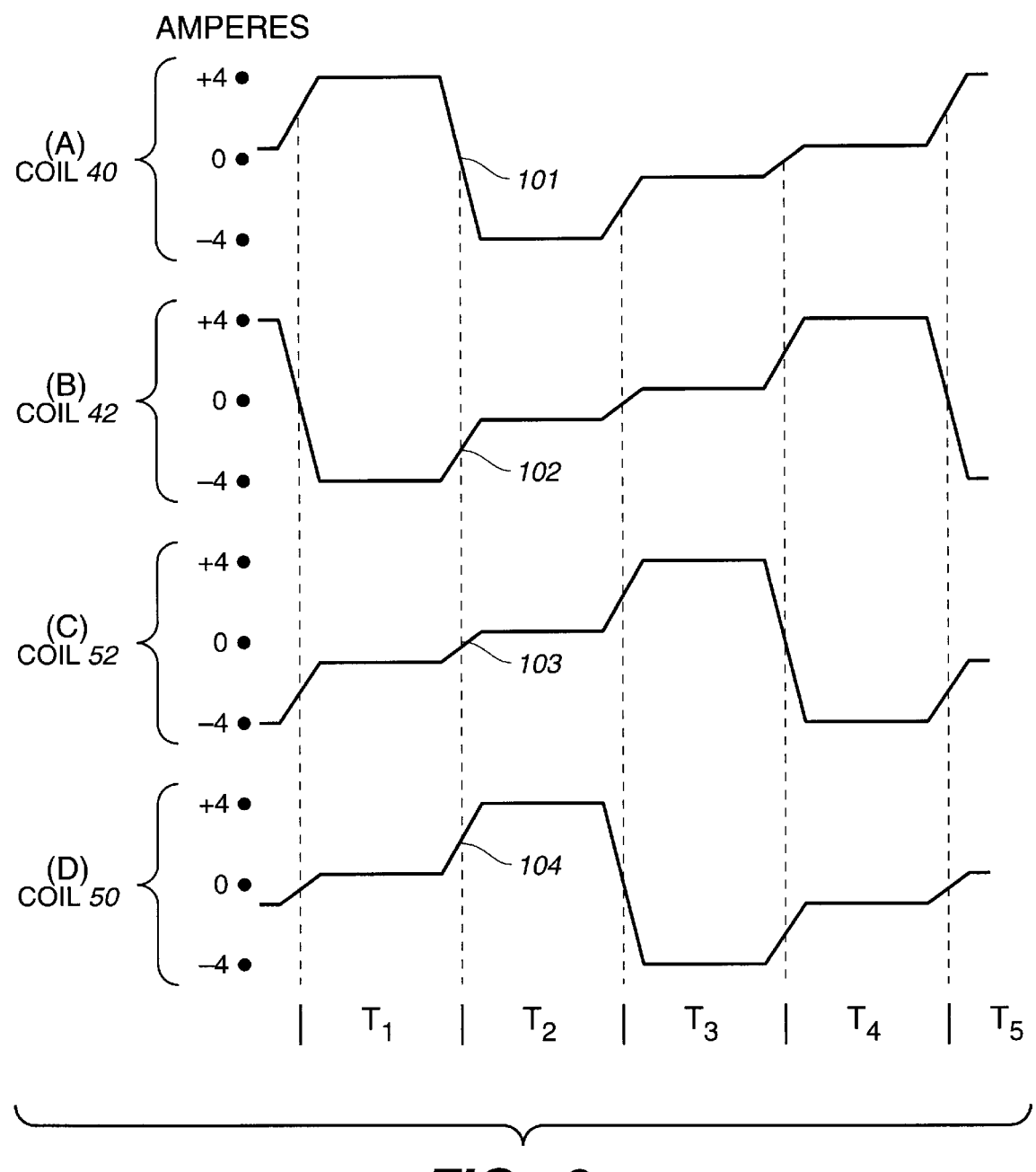
FIG._8

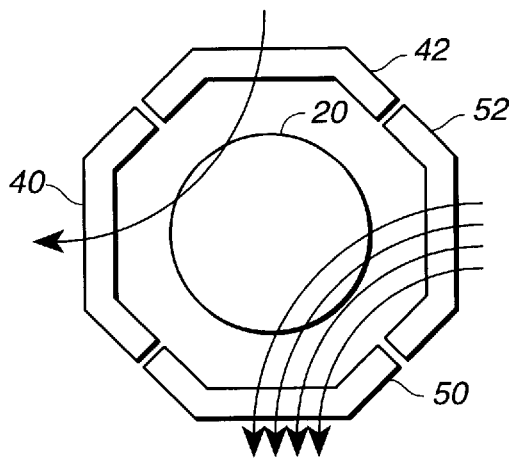
FIG._9A
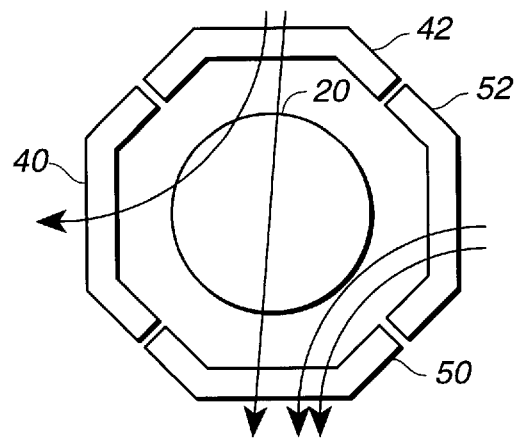
FIG._9B
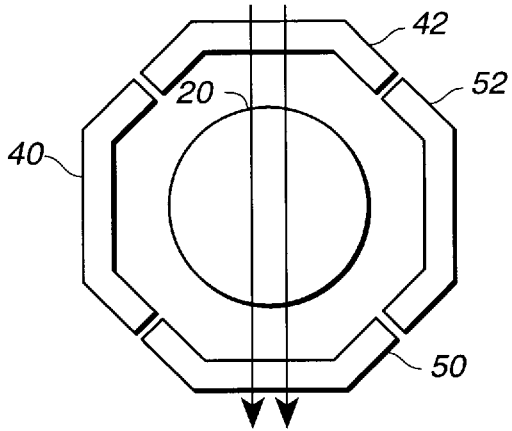
FIG._9C
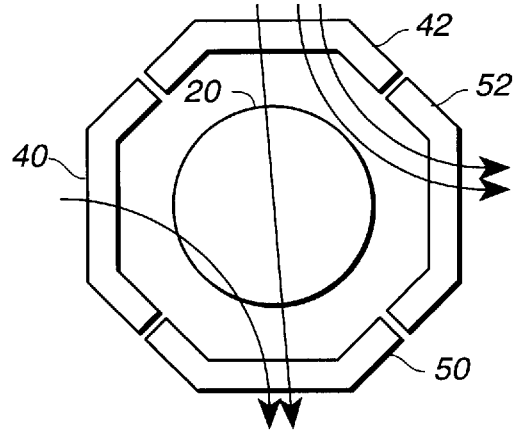
FIG._9D
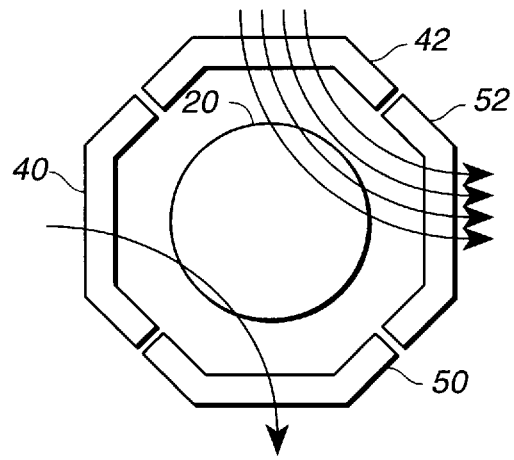
FIG._9E

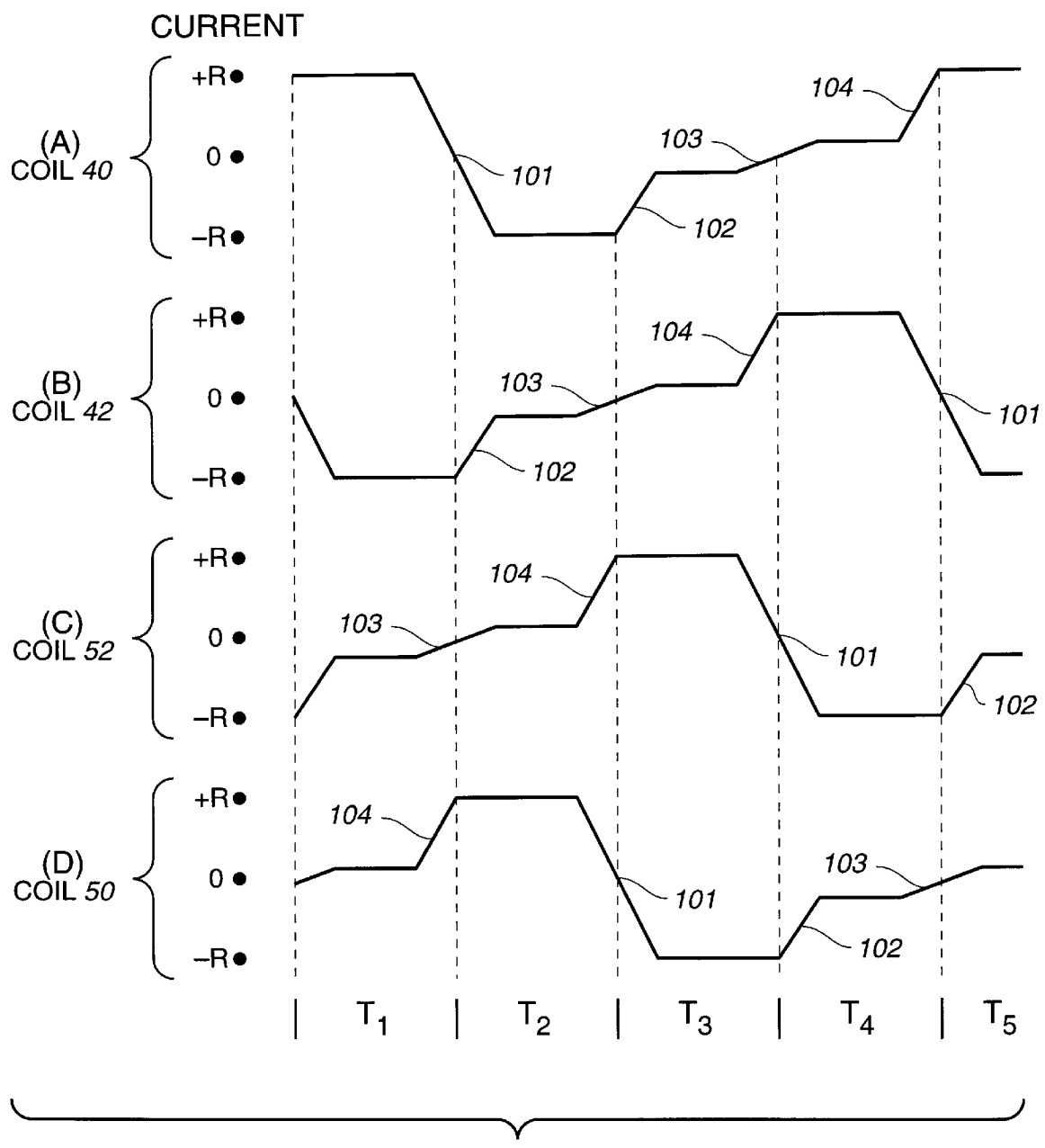
FIG._10

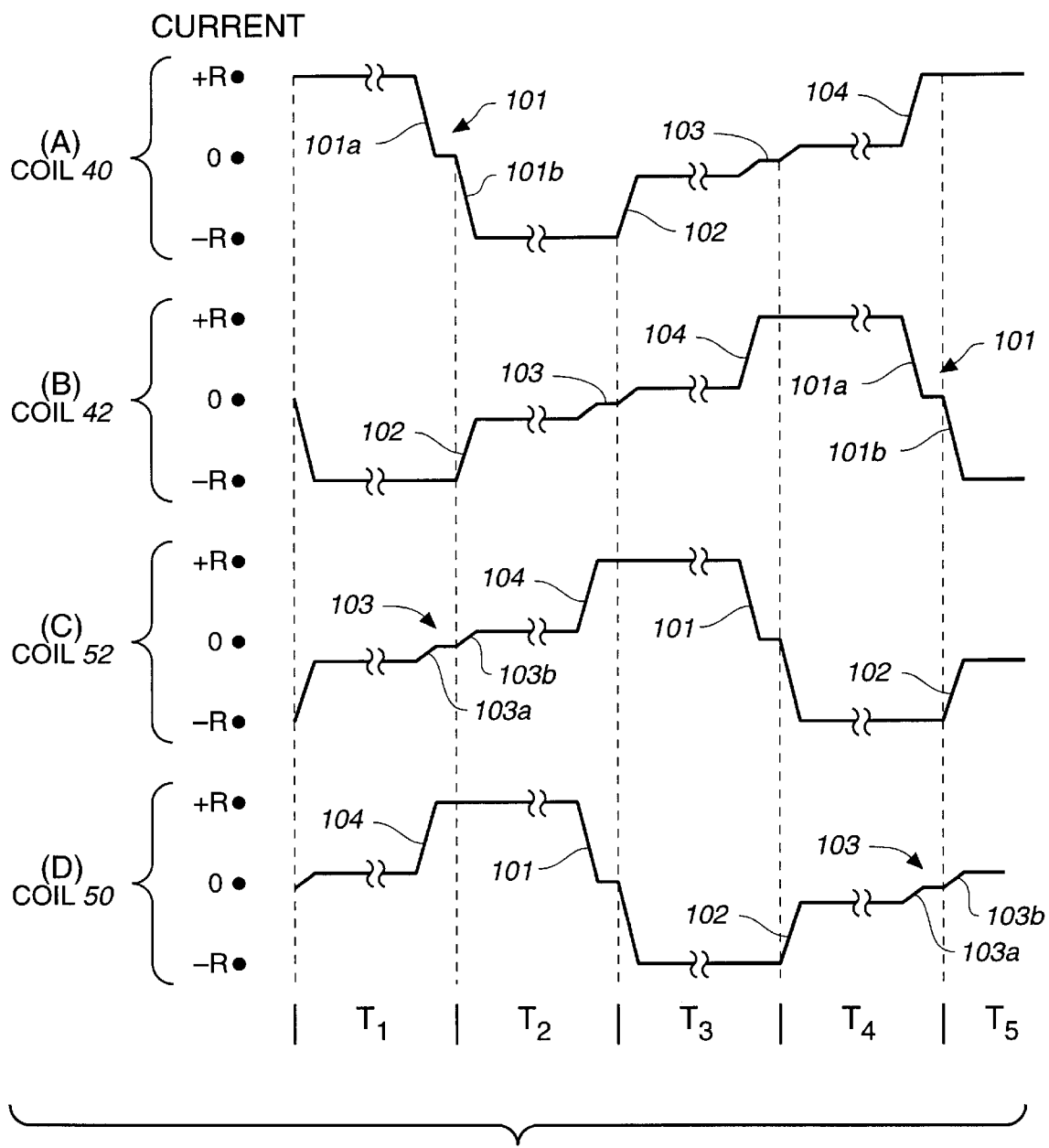
FIG._11

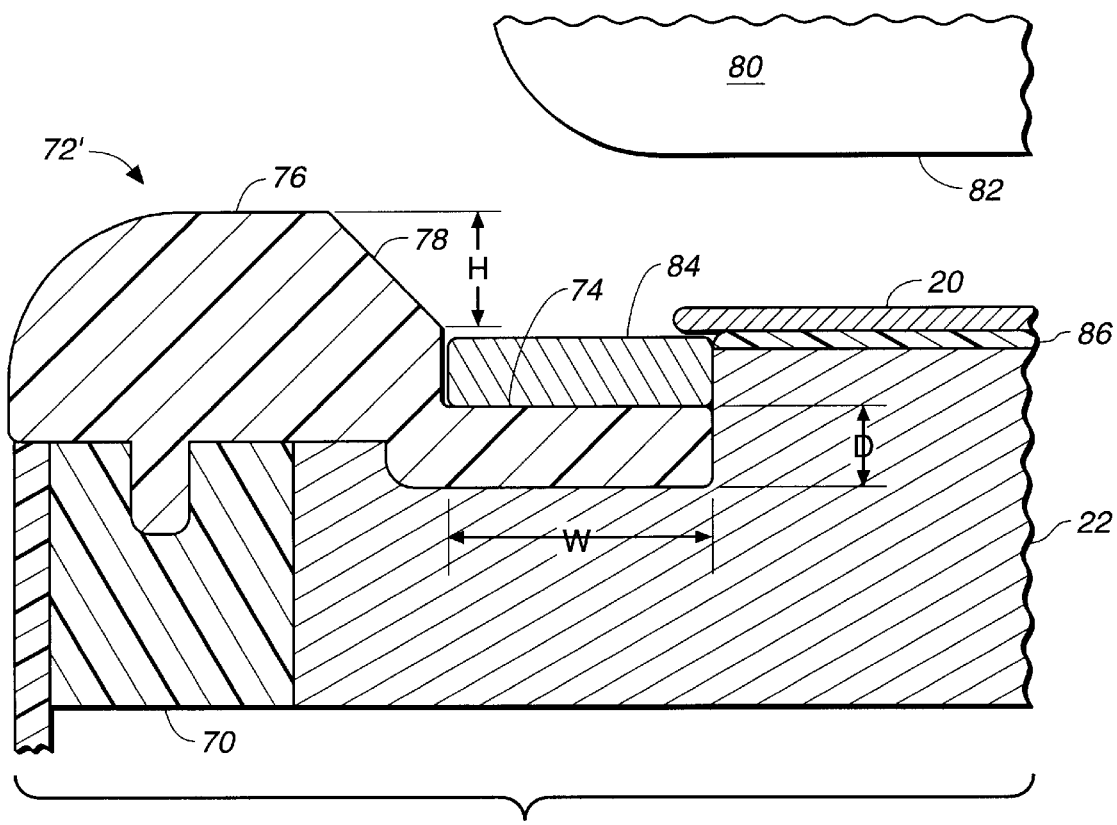
FIG._12
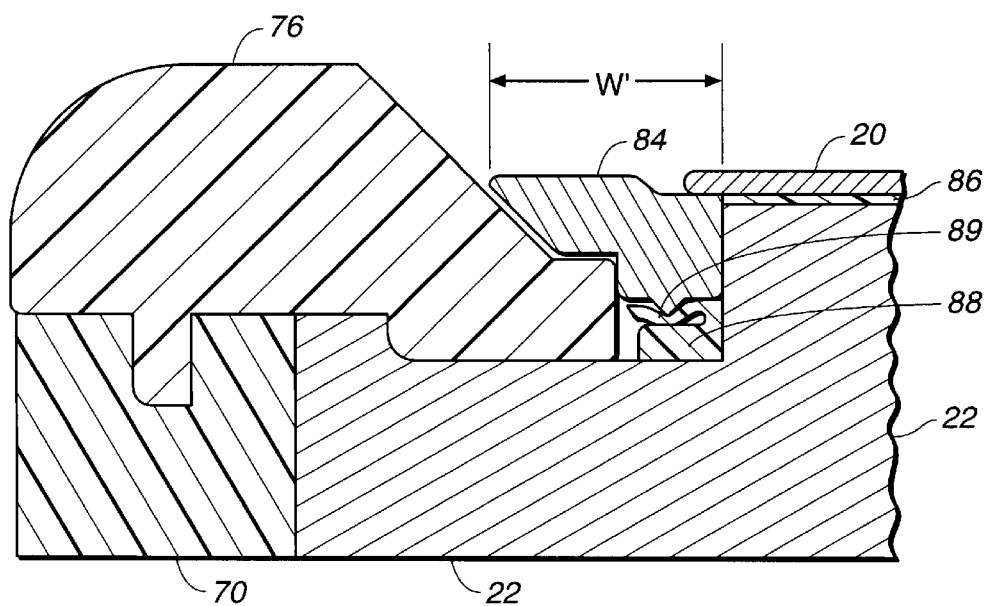
FIG._13

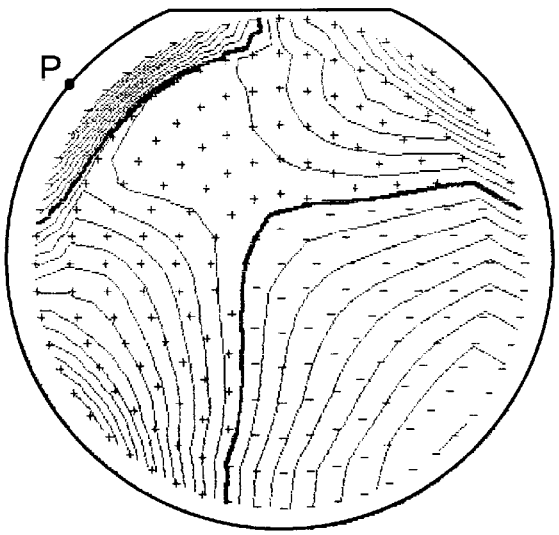
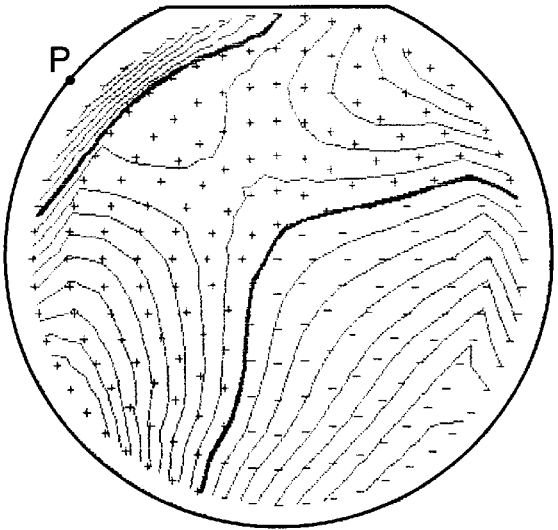
FIG._14A  FIG._14B
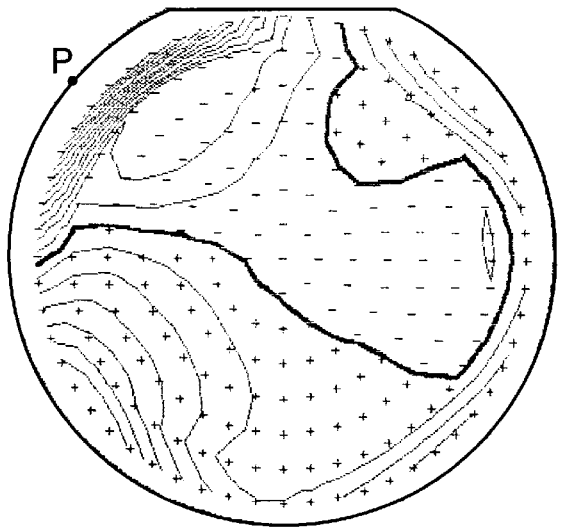
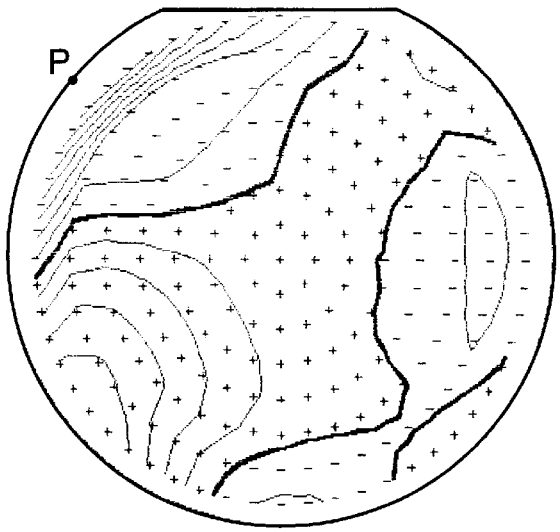
FIG._15A  FIG._15B

Etch Rate Uniformity versus Inner Dielectric Thickness

| Test Conditions | | | Etch Rate (Å/min.) | | | |
|---|---|---|---|---|---|---|
| Isometric Chart | Inner Dielectric 74 | R | Mean | Minimum | Maximum | Nonuniformity (one sigma) |
| Fig. 14A | Thick | 0 | 4270 | −1060 | +1250 | 10.9 % |
| Fig. 14B | Thin | 0 | 3940 | −850 | +1050 | 10.2 % |
| Fig. 15A | Thick | 4 | 4430 | −1340 | +750 | 6.9 % |
| Fig. 15B | Thin | 4 | 4060 | −770 | +520 | 4.9 % |

*FIG._16*

MAGNETICALLY-ENHANCED PLASMA CHAMBER WITH NON-UNIFORM MAGNETIC FIELD

FIELD OF THE INVENTION

The invention relates generally to semiconductor fabrication process chambers employing magnetically-enhanced plasmas. More particularly, the invention relates to such chambers having a non-uniform magnetic field which enhances the instantaneous uniformity of ion bombardment of a semiconductor workpiece.

BACKGROUND OF THE INVENTION

Semiconductor fabrication process chambers commonly employ plasmas to enhance the performance of various processes for fabricating semiconductor devices on silicon wafers or other workpieces. Such processes include sputter etching, plasma-enhanced chemical etching, plasma-enhanced chemical vapor deposition, and ionized sputter deposition. The high energy level of reagents in the plasma generally increases the rate of the fabrication process, and often reduces the temperature at which the semiconductor workpiece must be maintained to perform the process.

Magnetically-enhanced plasma chambers employ magnetic fields to increase the density of charged particles in the plasma, thereby further increasing the rate of the plasma-enhanced fabrication process. Increasing the process rate is highly advantageous because the cost of fabricating semiconductor devices is directly proportional to the time required for fabrication.

Despite this advantage, many plasma chambers in commercial use do not employ magnetic enhancement, because magnetic enhancement has been found to increase the likelihood of damaging the semiconductor devices on the wafer. (See Fang & McVittie, "Charging damage to gate oxides in an $O_2$ magnetron plasma", J. Appl. Phys., vol. 72, no. 10, pp. 4865–4872, Nov. 15, 1992; and Fang & McVittie, "The role of 'antenna' structure on thin oxide damage from plasma induced wafer charging", Mat. Res. Soc. Symp. Proc., vol. 265, pp. 231–236, 1992.) Therefore, a need exists for a magnetically-enhanced plasma chamber that affords the benefits of conventional magnetic enhancement but with a reduced risk of semiconductor device damage.

SUMMARY OF THE INVENTION

We believe that a major cause of semiconductor device damage in conventional magnetically-enhanced plasma chambers is that the uniform magnetic field conventionally considered ideal actually causes an E×B drift of electrons in the plasma pre-sheath, which in turn causes the ion flux bombarding the semiconductor wafer or workpiece to have a highly non-uniform distribution across the surface area of the workpiece. Our invention is a magnetically-enhanced plasma chamber which creates a more uniform instantaneous distribution of ion flux over the surface of the workpiece.

Specifically, in our invention the plasma is magnetically enhanced by a magnet which produces a novel magnetic field pattern. Within a region parallel to and adjacent to the workpiece surface, the magnitude and direction of the instantaneous magnetic field are related in such a way that the direction of the magnetic field at any point within said region is approximately the vector cross product of (1) the gradient of the magnitude of the magnetic field at that point, and (2) a vector extending perpendicularly from the workpiece surface toward the plasma.

We believe the direction of our magnetic field produces an E×B drift of electrons in the pre-sheath away from the region where the magnitude of the magnetic field is highest, and toward the region where the magnitude is lowest. The resulting E×B drift counteracts the tendency for the rate of production of free electrons to be highest in the region where the magnitude of the magnetic field is highest. Accordingly, it is possible to balance the effects of the E×B drift and the magnitude non-uniformity to achieve enhanced instantaneous uniformity of free electron concentration in the pre-sheath adjacent the semiconductor workpiece. We believe that this enhanced instantaneous uniformity of electron distribution produces an enhanced instantaneous uniformity of the distribution of ion flux bombarding the workpiece.

BRIEF DESCRIPTION OF THE DRAWINGS

FIGS. 1A and 1B are a schematic longitudinal sectional view and a schematic top view, respectively, of a magnetically-enhanced plasma chamber.

FIG. 2A is a schematic top view of an embodiment of the invention using one pair of orthogonal coils. FIG. 2B shows a similar embodiment having one pair of coplanar coils.

FIG. 3A is a schematic top view of an embodiment of the invention using two pairs of orthogonal coils. FIG. 3B shows a similar embodiment in which the ends of each coil angle inward by 45°.

FIG. 4 is a schematic top view of the embodiment of FIG. 3B, showing magnetic field strength measurements at five locations.

FIG. 5 is a schematic top view of the magnetic field pattern of an alternative embodiment in which the magnetic field has a rotation or vector curl function opposite of that of the FIG. 3A and 3B embodiments.

FIG. 6 is a schematic top view of the magnetic field pattern of an alternative embodiment in which the magnetic field is linear in orientation but non-uniform in magnitude.

FIGS. 7A–7D are a timing diagram of the electrical current through the four electromagnet coils of FIG. 3 when the coil current is changed abruptly at the beginning of each rotation step.

FIGS. 8A–8D are a timing diagram of the electrical current through the four electromagnet coils of FIG. 3 when the coil current is changed gradually and linearly at the beginning of each rotation step.

FIGS. 9A–9E is a schematic top view of the magnetic field pattern produced by the rotation method of FIG. 8 during the transition between rotation steps.

FIGS. 10A–10D and 11A–11D are timing diagrams of the electrical current through the four electromagnet coils of FIG. 3 when the coil current is changed at the beginning of each rotation step at staggered rates and times to maintain a more constant magnetic field strength. FIGS. 10 and 11 respectively show linear transitions and two-step transitions between rotation steps.

FIG. 12 is a side view of the edge of a silicon ring overlying a quartz shield, wherein the wafer does not contact the silicon ring.

FIG. 13 is a side view of the edge of a silicon ring overlying a quartz shield, wherein the wafer contacts the silicon ring.

FIGS. 14A–14B and 15A–15B are isometric charts of the spatial distribution of the etch rate as a function of the type of dielectric shield ring and the magnetic field pattern.

FIG. 16 is a table showing the etch rate and uniformity as a function of the type of dielectric shield ring and the magnetic field pattern.

DETAILED DESCRIPTION OF THE PREFERRED EMBODIMENTS

1. Magnetically-enhanced Plasma Chamber

Before describing the invention, the reasons for instantaneous non-uniformity of ion flux in conventional magnetically-enhanced plasma chambers will be explained. FIG. 1 shows a magnetically-enhanced plasma chamber suitable for either etching or chemical vapor deposition (CVD).

The vacuum chamber is enclosed by cylindrical side wall 12, circular bottom wall 14, and circular top wall or lid 16. The lid 16 and bottom wall 14 may be either dielectric or metal. An electrically grounded anode electrode 18 is mounted at the bottom of the lid 16. The anode electrode may be perforated to function as a gas inlet through which process gases enter the chamber. The side wall 12 may be either dielectric or metal. If it is metal, the metal must be a non-magnetic material such as anodized aluminum so as to not interfere with the magnetic field created by electromagnet coils outside the chamber. If the side wall is metal, it will function as part of the anode.

The semiconductor wafer or workpiece 20 is mounted on a cathode electrode 22, which, in turn, is mounted in the lower end of the chamber. A vacuum pump, not shown, exhausts gases from the chamber through exhaust manifold 23 and maintains the total gas pressure in the chamber at a level low enough to facilitate creation of a plasma, typically in the range of 10 millitorr to 20 torr, with pressures at the lower and higher ends of the range being typical for etching and CVD processes, respectively.

An RF power supply 24 is connected to the cathode electrode 22 through a series coupling capacitor 26. The RF power supply provides an RF voltage between the cathode electrode and the grounded anode electrode 18 which excites the gases within the chamber into a plasma state. The plasma body has a time-average positive DC potential or voltage relative to the cathode or anode electrodes which accelerates ionized process gas constituents to bombard the cathode and anode electrodes.

Magnetic enhancement of the plasma most commonly is implemented by a DC magnetic field in the region between the cathode and anode electrodes. The direction of the magnetic field is transverse to the longitudinal axis of the chamber, i.e., transverse to the axis extending between the cathode and anode electrodes. Various arrangements of permanent magnets or electromagnets are conventionally used to provide such a transverse magnetic field. One such arrangement is the pair of coils 30 shown in FIG. 1, disposed on opposite sides of the cylindrical chamber side wall 12. The two coils 30 are connected in series and in phase to a DC power supply, not shown, so that they produce transverse magnetic fields which are additive in the region between the two coils. This transverse magnetic field is represented in FIGS. 1A and 1B by the vector B oriented along the negative x-axis. In the preferred embodiment, the diameter of each coil approximately equals the spacing between the two coils. (The second pair of coils 32 shown in FIG. 1B will be discussed later, but may be ignored for purposes of the present discussion.) An example of such a magnetically enhanced plasma etch chamber is described in commonly assigned U.S. Pat. No. 5,215,619 issued Jun. 1, 1993 to Cheng et al., the disclosure of which is hereby incorporated into the present patent specification.

Because the plasma body has a positive time-average potential or voltage relative to the cathode electrode 22, the time-average electric field E in the plasma pre-sheath adjacent the cathode will be directed downward from the plasma toward the cathode, thereby giving the free electrons in the pre-sheath a drift velocity vector v whose time-averaged value is oriented upward toward the plasma body, as represented by the vector $v_e$ in FIG. 1A. In response to the DC magnetic field vector B, these free electrons additionally will experience a qv×B force—commonly called an E×B drift—whose time-averaged value is approximately coplanar with the semiconductor wafer 20 and orthogonal to the magnetic field vector B, as illustrated in FIG. 1B by the E×B vector oriented along the y-axis.

(In this discussion, the term "time average" means averaged over one period of the RF frequency or frequencies at which the plasma is excited, this period typically being less than $10^{-7}$ second. This time average over one RF period is unrelated to the time averaging due to optional rotation of the workpiece relative to the magnetic field, which typically has a rotation period on the order of 0.1 to 2 seconds.)

We believe that this E×B drift of free electrons is a major source of semiconductor device damage in conventional magnetically-enhanced plasma chambers. Specifically, we believe the E×B drift unevenly distributes the free electrons in the plasma pre-sheath, so that the electron concentration progresses from minimum to maximum from the negative y-axis to the positive y-axis. In other words, the electron concentration in the pre-sheath is lowest near the 6 o'clock (270° azimuth) position of the wafer 20, and is highest near the 12 o'clock (90° azimuth) position of the wafer. A high electron concentration produces a high ion concentration, hence the flux of ions bombarding the wafer is lowest and highest at the 6 o'clock and 12 o'clock positions of the wafer, respectively. We believe this spatial non-uniformity of ion flux bombarding the wafer produces electrical currents in the wafer which often damage the semiconductor devices on the wafer.

Although the present invention does not depend on this theory, we believe the mechanism of damage due to ion flux instantaneous spatial non-uniformity is as follows. An ion flux spatial non-uniformity causes spatially non-uniform accumulation of electrical charge on the wafer. The differential in electrical charge produces voltages and current flow between different points on the wafer. If the voltage across any of the dielectric structures fabricated on the wafer exceeds the maximum safe voltage of that dielectric structure, then a current will flow through the structure which is likely to damage the dielectric structure and therefore damage one or more semiconductor devices on the wafer. We believe a more uniform spatial distribution of instantaneous ion flux bombarding the wafer would reduce the likelihood of such damage.

Conventional magnetically-enhanced plasma chambers attempt to ameliorate this non-uniformity by slowly rotating the magnetic field relative to the wafer, typically at a rotation frequency in the range of one-half to five rotations per second. In some designs, the wafer 20 or the magnet 30 is physically rotated. In other designs, as illustrated in FIG. 1B, the rotation is performed electronically by providing a second pair of coils 32 orthogonal to the first pair of coils 30. The magnetic field can be rotated in 90-degree increments by successively and periodically connecting the DC power supply: (1) to the first coil pair 30 with positive polarity; (2) to the second coil pair 32 with positive polarity; (3) to the first coil pair 30 with negative polarity; and (4) to the second coil pair 32 with negative polarity. Alternatively, the magnetic field can be rotated continuously by replacing the DC power supply with a very low frequency (in the range of 0.1 to 10 Hz) power supply having quadrature outputs connected to provide current to the first coil pair 30 offset in phase by 90 degrees from the current provided to the second coil pair 32.

Rotating the magnetic field relative to the wafer greatly reduces time-average spatial non-uniformity in the ion flux bombarding the wafer, and therefore can provide acceptable spatial uniformity of etch rate (in an etching chamber) or deposition rate (in a CVD chamber) on the wafer surface. However, rotating the magnetic field does not in any way improve the instantaneous spatial uniformity of ion flux on the wafer surface, and therefore does not solve the problem of semiconductor device damage in magnetically-enhanced plasma chambers. Consequently, magnetic enhancement heretofore has been used only in a small fraction of commercial plasma chambers for semiconductor fabrication.

2. Overview of the Invention

Our invention improves the instantaneous spatial uniformity of ion flux on the wafer surface by providing a magnetic field which is weakest in the region of the plasma pre-sheath to which electrons will be swept by the E×B drift, and which is strongest in the region from which electrons will be swept by the E×B drift. Stated more mathematically, our invention provides a magnetic field whose magnitude at points in the plane of the wafer is characterized by a gradient vector pointing in the opposite direction of—i.e., oriented approximately 180-degrees from—the projection of the E×B vector in the plane of the wafer. (The magnetic field need not have this property over the entire surface of the wafer; our invention remains advantageous if the magnetic field has this property over a majority of the surface of the wafer.)

Regions of the plasma having a higher magnetic field magnitude will have a higher density of free electrons. By providing the strongest magnetic field magnitude in the region of the plasma pre-sheath where the E×B drift will tend to deplete the electron concentration, and by providing the weakest magnetic field where the E×B drift will tend to augment the electron concentration, our invention tends to equalize the electron concentration throughout the pre-sheath adjacent the wafer. A more spatially uniform electron concentration in the pre-sheath produces a more spatially uniform flux of ions bombarding the wafer. Accordingly, our invention greatly improves the instantaneous spatial uniformity of ions bombarding the wafer, and thereby reduces the risk of damage to semiconductor devices on the wafer.

3. Curved Magnetic Field Produced by One Pair of Adjacent Magnetic Poles

FIG. 2A shows one embodiment of the invention employing two adjacent, orthogonal coils to generate the magnetic field. The two identical annular coils are connected together in series or, as illustrated in the figure, in parallel. The series or parallel combination is connected to a DC power supply 60. Preferably, the output current of the DC power supply 60 is controlled by a conventional microcontroller or microprocessor 65 to facilitate adjustment of the magnetic field strength by a human operator.

The first coil 40 is located at the 9 o'clock side (180° azimuth) of the wafer 20, is oriented perpendicular to the x-axis, and is connected to the DC power supply with a polarity which produces a magnetic field oriented along the x-axis, i.e., in the positive x-direction or the 0° azimuth direction. The second coil 42 is located at the 12 o'clock side (90° azimuth) of the wafer 20, is oriented perpendicular to the y-axis, and is connected to the DC power supply 60 with a polarity which produces a magnetic field oriented along the y-axis, i.e., in the positive y-direction or the 90° azimuth direction. (To simplify the drawing, the chamber wall 12 surrounding the wafer is omitted from FIG. 2A and subsequent figures.)

The two coils produce a magnetic field in a region just above the wafer surface (specifically, in the region that includes the plasma sheath and pre-sheath adjacent the wafer) which is counterclockwise when viewed from above the wafer, looking down toward the wafer surface. In mathematical terms, the vector "curl" function of the magnetic field ($\nabla \times B$) in the region just above the wafer surface points upward from the wafer surface towards the plasma body. In FIG. 2A the counterclockwise magnetic field pattern is represented by circular arcs 44a, 44b, 44c, 44d terminating in arrowheads pointing toward the second coil 42. Above the surface of the wafer 20, the magnetic field strength is greatest at the point P on the perimeter of the wafer at a 135° azimuth because the two coils are closest to each other at that point, i.e., the magnetic field line 44a through that point P is shorter than any other magnetic field line crossing the surface of the wafer. The magnetic field is weakest at the point Q on the perimeter of the wafer at a 315° azimuth because the two coils are farthest from each other at that point, i.e., the magnetic field line 44d through that point Q is longer than any other magnetic field line crossing the surface of the wafer. Another way of defining points P and Q is that they are the points on the wafer surface which are nearest and farthest, respectively, from the vertex "V" of the angle between the two electromagnet coils 40 and 42.

The counterclockwise magnetic field pattern produces an E×B drift of the free electrons in the plasma pre-sheath in a direction orthogonal to the field lines, as illustrated by the E×B vectors in FIG. 2A. More specifically, the E×B vectors at different points over the wafer surface point in different directions, but they always point away from the highest magnitude magnetic field line 44a and toward the lowest magnitude magnetic field line 44d. For example, the E×B drift of the free electrons is away from the point P having the highest magnetic field strength and toward the point Q having the lowest magnetic field strength.

The spatial variation in magnetic field strength tends to produce the highest electron concentration in the pre-sheath near point P, and the lowest electron concentration in the pre-sheath near point Q. However, the orientation of the E×B vectors tends to produce the opposite result, i.e., the lowest and highest electron concentrations in the pre-sheath near points P and Q, respectively. Therefore, the effects of magnetic field strength variation and E×B drift tend to offset each other, thereby producing a more spatially uniform instantaneous distribution of free electrons in the pre-sheath adjacent the wafer surface.

This more spatially uniform instantaneous distribution of free electrons in the pre-sheath produces a more uniform instantaneous spatial distribution of ion flux bombarding the wafer, thereby reducing the risk of damage to semiconductor devices on the wafer.

As in conventional designs, the time-averaged uniformity of etch rate or deposition rate, in the case of etch chambers or CVD chambers, respectively, can be further improved by slowly rotating the two magnets relative to the wafer, or by rotating the wafer relative to the magnets. The rotation can be performed electrically, rather than mechanically, by providing an array of electromagnets encircling the workpiece, and powering the electromagnets in a sequence which causes the magnetic field to rotate around the center of the workpiece. This electrical rotation method is described in more detail in a subsequent part of this patent specification.

The two electromagnets have been described as orthogonal because such a geometry permits the electromagnets to be positioned as close as possible to a circular semiconductor wafer 20. However, the magnetic field pattern of the present invention will be produced even if the angle between the two electromagnets is changed dramatically. To illustrate this principle with an extreme example, FIG. 2B shows the magnetic field created by two electromagnets 40 and 42 which are coplanar, so that the angle between them is either 0° or 180°, depending on one's point of view. The magnetic field pattern over the wafer 20 satisfies the requirements of the invention, because the gradient of the magnetic field is roughly perpendicular to the direction of the magnetic field, and the curvature of the magnetic field is counterclockwise relative to the point P on the wafer where the magnetic field is strongest.

Of more practical value than the coplanar example shown in FIG. 2B would be a geometry in which the angle between two adjacent electromagnets 40 and 42 is in the range of 45° to 150°. Increasing the angle would be expected to increase the gradient of the magnet field strength from point P to point Q, thereby affecting the spatial uniformity of the ion flux over the surface of the wafer 20. The uniformity could be optimized by adjusting the angle between the two electromagnets. For example, if two perpendicular electromagnets produced a greater ion flux at point Q than at point P, then increasing the angle between the two coils would be expected to reduce the ion flux at point Q and thereby improve the spatial uniformity.

Another possible reason to orient the two electromagnets at an angle other than 90° is to permit employing an array of more than four electromagnets around the perimeter of the wafer. More magnets would permit fine tuning the magnetic field pattern over the surface of the wafer to optimize ion flux spatial uniformity. If the electromagnets are arranged as a regular polygon encircling the wafer, then the angle between two adjacent electromagnets is 180°−(360°/N), where N is the number of electromagnets, i.e., the number of faces in the polygon.

In another alternative embodiment, the magnetic field pattern of the present invention can be produced if the two electromagnets 40 and 42 are replaced by north and south magnetic pole pieces, respectively, at approximately the same locations as the electromagnets 40 and 42, respectively. The north and south pole pieces can be connected to the north and south poles, respectively, of a single magnet of any type, including a permanent magnet or an electromagnet. One advantage of using a single magnet with two pole pieces is that the magnetic field will be more concentrated in the area between the two pole pieces where the wafer 20 is located.

4. Curved Magnetic Field From Two Pairs of Orthogonal Coils

Our experiments with the two coil embodiment just described indicate that, for the specific coil geometry shown in FIG. 2A, the differential in electron concentration due to spatial variation of magnetic field strength exceeds the differential due to E×B drift. Consequently, while the spatial uniformity of ion flux was greatly improved over conventional magnetically enhanced plasma chambers, the ion flux near point P was greater than the ion flux near point Q.

The embodiment shown in FIG. 3A further improves the spatial uniformity by adding a second pair of orthogonal coils 50 and 52. The second pair of coils augments the strength of the magnetic field near point Q to reduce the rate at which the magnetic field strength declines from point P to point Q. Preferably, the total magnetic flux produced by the second coil pair should be sufficiently less than that produced by the first coil pair so that the combined magnetic field from the two coil pairs still declines in strength from point P to point Q. In other words, the second coil pair preferably reduces the rate of decline, but does not eliminate or reverse the decline, from point P to point Q in the magnetic field strength. The ratio R (where R>1) of the total magnetic flux produced by the first or "primary" coil pair 40, 42 to the total magnetic flux produced by the second or "secondary" coil pair 50, 52 should be adjusted, by means described below, to maximize the spatial uniformity of the ion flux over the surface of the wafer 20.

The second pair of coils 50, 52 either is connected to the same DC power supply 60 as the first pair of coils 40, 42, or else it is connected to a second DC power supply 62. The latter is preferable because it permits the microcontroller 65 to independently adjust the voltage or current supplied to the two pairs of coils by adjusting the two power supplies.

The two coils 50, 52 in the second pair are identical to each other, but need not be identical to the two coils 40, 42 of the first pair. The first coil 50 is located at the 6 o'clock side (270° azimuth) of the wafer 20, is oriented perpendicular to the y-axis, and is connected to the second DC power supply 62 with a polarity which produces a magnetic field oriented along the y-axis, i.e., in the positive y-direction or the 90° azimuth direction. The second coil 52 is located at the 3 o'clock side (0° azimuth) of the wafer 20, is oriented perpendicular to the x-axis, and is connected to the second DC power supply 62 with a polarity which produces a magnetic field oriented opposite to the x-axis, i.e., in the negative x-direction or the 180° azimuth direction.

The second pair of coils 50, 52 produces a magnetic field having a clockwise circular pattern in a region just above the wafer surface, specifically, in the region that includes the plasma sheath and pre-sheath adjacent the wafer. In mathematical terms, the vector "curl" function of the magnetic field ($\nabla \times B$) in the region just above the wafer surface points downward toward the wafer surface from the direction of the plasma body immediately above the wafer. In FIG. 3 the clockwise magnetic field pattern is represented by circular arcs 54a, 54b, 54c, 54d terminating in arrowheads pointing toward the second coil 52. This is the opposite of the counterclockwise pattern 44 of the magnetic field produced by the first pair of coils 40, 42.

Above the surface of the wafer 20, the magnetic field strength from the second pair of coils is greatest at the point Q on the perimeter of the wafer at a 315° azimuth because the two coils of the second pair 50, 52 are closest to each other at that point. The magnetic field is weakest at the point P on the perimeter of the wafer at a 135° azimuth because the two coils of the second pair are farthest from each other at that point.

FIG. 3B shows a alternative embodiment which differs from the FIG. 3A embodiment only in that the sides of each coil are angled inward by 45°, so that the four coils together have an octagonal cross section. This embodiment was designed to facilitate mounting the coils on the side walls 12 of a process chamber whose side walls have an octagonal outer surface. Examples of such a process chamber are described in U.S. Pat. No. 5,215,619 issued Jun. 1, 1993 to Cheng et al. and U.S. Pat. No. 5,225,024 issued Jul. 6, 1993 to Hanley et al., both patents being assigned to the same assignee of the present application, and the disclosures of both patents are hereby incorporated by reference into the present patent specification.

The purpose of the octagonal shape is simply to facilitate mounting a number of chambers closer together than would be possible with rectangular chambers, so as to minimize the floor space occupied by the apparatus. The octagonal shape was not chosen to enhance the magnetic field pattern.

The second or "secondary" pair of coils 50, 52 is designed or adjusted to produce a weaker magnetic field than the first or "primary" pair of coils 40, 42. For example, the number of turns of wire in each of the coils 40, 42 in the first pair may be R times greater than the number of turns of wire in each of the coils 50, 52 in the second pair, thereby producing an R times greater magnetic field. More preferably, the first and second pairs of coils are identical, but they are connected to first and second DC power supplies 60 and 62, respectively, and the controller 65 adjusts one or both of the two power supplies so that the current supplied by the first power supply 60 to the first coil pair 40,42 is R times greater than the current supplied by the second power supply 62 to the second coil pair 50, 52.

FIG. 4 shows magnetic field strength measurements in the center and at four points on the perimeter of a 200 mm diameter wafer in the just described embodiment of FIG. 3B. Each of the four coils was identical. Each coil had 300 turns of wire and was 33 cm long from tip to tip. The straight, central portion of each coil was 29 cm long. The separation between coils on opposite sides of the wafer (e.g., the separation between coils 42 and 50) was 36 cm. For these measurements, the first power supply 60 provided 4 A current to the coils of the first pair, and the second power supply 62 provided 1 A current to the coils of the second pair, hence R=4.

The ratio R should be adjusted to maximize the spatial uniformity of the ion flux bombarding the wafer 20. Uniformity will be best when the E×B drift of ions from point P to point Q in the plasma sheath is offset by the greater rate of ion generation near point P due to the higher magnetic field strength at point P relative to point Q.

We have found that the value for the ratio R that optimizes the spatial uniformity of ion flux bombarding the wafer varies for different processes that may be performed in a plasma chamber. In particular, as described below, we found the optimum value for R depends on the chamber pressure. Therefore, to employ the magnetic enhancement method of the invention to enhance a conventional plasma etch or plasma CVD process, we recommend performing the desired etch or CVD process on a succession of wafers with the two power supplies adjusted to supply different levels of current to the first and second coil pairs. The spatial uniformity of etch or deposition on each wafer can be measured using a conventional laser interferometer. The coil current values which achieve the best combination of process rate and spatial uniformity can be selected based on the measurements.

If the magnetic field pattern is rotated relative to the wafer as described below, the rotation should be turned off or defeated while performing the above spatial uniformity tests. Otherwise, the azimuthal averaging effect of the rotation will disguise the instantaneous non-uniformity of the process.

In another alternative embodiment, the magnetic field pattern of the present invention can be produced if the two primary electromagnets 40 and 42 are replaced by north and south magnetic pole pieces, respectively, at approximately the same locations as the electromagnets 40 and 42, respectively. The north and south pole pieces can be connected to the north and south poles, respectively, of a single magnet of any type, including a permanent magnet or an electromagnet. Similarly, the two secondary electromagnets 50 and 52 can be replaced by north and south magnetic pole pieces, respectively, at approximately the same locations as the electromagnets 50 and 52, respectively. The secondary north and south pole pieces can be connected to the north and south poles of a magnet of any type, which can be called the "secondary" magnet. The magnetic strength of the primary magnet should be R times greater than that of the secondary magnet.

Comparative Examples

We measured the spatial uniformity of etching a silicon oxide layer on a 200 mm diameter silicon wafer for a plasma etch process using, different ratios R between the current flow through identical first and second coil pairs. In each case, the process gas mixture consisted of 45 sccm $CHF_3$, 15 sccm $CF_4$, and 150 sccm Ar. The chamber was a capacitively coupled design similar to that shown in FIG. 1, and an RF power supply 24 connected between the cathode 22 and anode 18 was adjusted to provide 1000 watts of RF power at a frequency of 13.56 MHz. The interferometer measured the thickness of the oxide layer at 225 points uniformly distributed over the wafer surface. We assessed spatial uniformity of instantaneous etch rate based on the standard deviation ("one sigma") of the 225 thickness measurements and on the difference between the maximum and minimum thicknesses and the mean thickness.

In one series of such tests, we compared the instantaneous etch rate uniformity of the 4-coil embodiment of FIG. 3B with the 2-coil embodiment of FIG. 2. At a chamber pressure of 200 mT and a magnetic field of about 30 G at the center of the wafer (4 A of current to each primary coil 40, 42), we measured a one-sigma etch rate nonuniformity of 10.6% for the 2-coil embodiment, compared with 6.9% and 7.4%, respectively, for the 4-coil embodiment with R=4 and R=6.7, respectively. Therefore, the 4-coil embodiment of FIG. 3B is superior to the 2-coil embodiment of FIG. 2 because it improved the instantaneous etch rate uniformity by about 30%.

To determine the optimum value for R in the 4-coil embodiment of FIG. 3B, we performed additional tests for R=3.3 and R=5 using magnetic field strengths of 20 G and 60 G at the center of the wafer. In the 20 G tests, the one-sigma nonuniformity of the instantaneous etch rate was 5.4% and 4.7% with R=3.3 and R=5, respectively. In the 60 G tests, the nonuniformity was 8.5% and 7.4% with R=3.3 and R=5, respectively. These tests suggest that, for this etch process at 200 mT chamber pressure, the optimum value of R is about 4 or 5, because the nonuniformity increased at R=3.3 and R=6.7.

We repeated these tests at a chamber pressure of 75 mT and a magnetic field of about 20 G and 60 G. In the 20 G tests, the nonuniformity was 4.7% and 6.7% with R=3.3 and R=5, respectively. In the 60 G tests, the nonuniformity was 7.1% and 10.0% with R=3.3 and R=5, respectively. These tests suggest that, for this etch process at 75 mT chamber pressure, the nonuniformity is better with R=3.3 than with R=5, which is the opposite of the result at 200 mT. Therefore, the optimum setting for R is dependent on the chamber pressure.

5. Magnetic Field with Clockwise Curvature

The embodiments of the invention shown in FIGS. 2 and 3 each employ a magnetic field pattern having a counterclockwise curvature with respect to a point P at which the magnetic field strength is maximum. In an alternative embodiment, shown in FIG. 5, the magnetic field pattern near the surface of the wafer 20, represented by magnetic field lines 56a–56d, when viewed from above the wafer has a clockwise curvature with respect to a point Q at which the magnetic field strength is minimum. In mathematical terms, the vector "curl" function of the magnetic field ($\nabla \times B$) just above the surface of the wafer surface points downward toward the wafer from the direction of the plasma body immediately above the wafer.

In contrast to the embodiments of FIGS. 2 and 3, in the FIG. 5 embodiment the magnetic field strength is weakest near the center of curvature of the magnetic field lines and increases progressively away from the center of curvature. Of the four illustrated magnetic field lines 56a–56d, the magnetic field is strongest along field line 56a and is progressively weaker along field lines 56b, 56c, and 56d.

The clockwise magnetic field pattern produces an E×B drift of the free electrons in the plasma pre-sheath in a direction orthogonal to the field lines, as illustrated by the E×B vectors in FIG. 5. More specifically, the E×B vectors at different points over the wafer surface point in different directions, but they always point away from the highest magnitude magnetic field line 56a and toward the lowest magnitude magnetic field line 56d. For example, the E×B drift of the free electrons is away from the point P having the highest magnetic field strength and toward the point Q having the lowest magnetic field strength.

The variation in magnetic field strength tends to produce the highest electron concentration in the pre-sheath near point P, and the lowest electron concentration in the pre-sheath near point Q. However, the orientation of the E×B vectors tends to produce the opposite result, i.e., the lowest and highest electron concentrations in the pre-sheath near points P and Q, respectively. Therefore, the effects of magnetic field strength variation and E×B drift tend to offset each other, thereby producing a more spatially uniform instantaneous distribution of free electrons in the pre-sheath adjacent the wafer surface.

6. Linear Magnetic Field Pattern

FIG. 6 illustrates yet another embodiment of the invention in which the magnetic field above the surface of the wafer 20 is straight rather than curved. Specifically, above all points on the wafer surface, the magnetic field points in the x-axis direction, that is, in the 0° azimuth direction. Therefore, the magnetic field lines 58a–58d are parallel to the x-axis.

However, the magnetic field is not uniform. The magnetic field strength increases progressively along the direction of the y-axis. Referring to FIG. 6, the magnetic field strength is highest along the magnetic field line 58a having the highest y-coordinate, and the magnetic field strength is lowest along the magnetic field line 58d having the lowest y-coordinate. Therefore, the point on the wafer surface where the magnetic field strength is highest is point P at the 12 o'clock (90° azimuth) position on the wafer perimeter. Similarly, the point on the wafer surface where the magnetic field strength is lowest is point Q at the 6 o'clock (270° azimuth) position on the wafer perimeter.

Since the magnetic field vector B at any point on the wafer surface is oriented in the x-axis direction (0° azimuth direction), the E×B vector at any point on the wafer surface is oriented in the negative y-axis direction (270° azimuth direction). Consequently, the E×B drift will tend to increase the free electron concentration in the plasma pre-sheath toward the negative y-axis direction. On the other hand, the magnetic field strength is greatest toward the positive y-axis direction, thereby tending to increase the free electron concentration in the pre-sheath toward the positive y-axis direction. Therefore, the E×B drift and the spatial differential of the magnetic field strength tend to offset each other in their cumulative effect on the spatial distribution of the free electron concentration in the plasma pre-sheath. This results in a more uniform spatial distribution of free electrons, and a correspondingly more uniform instantaneous spatial distribution of ion flux bombarding the wafer surface.

7. Rotating Magnetic Field Relative to Workpiece

In any of the alternative forms of the invention described above, the magnetic field can be slowly rotated relative to the workpiece in order to improve the long-term time-averaged radial uniformity of the plasma-enhanced fabrication process being performed on the workpiece. For example, in an etch process, rotation will improve long-term time-averaged uniformity of etch rate, etch selectivity, and etch profiles in vias and other stepped features. Relative rotation between the workpiece and the magnetic field is conventional in prior art magnetically-enhanced plasma systems for semiconductor fabrication.

Either the workpiece or the magnets can be mechanically rotated.

More preferably, the magnetic field can be rotated electrically, rather than mechanically, if the magnetic field is produced by an array of electromagnet coils encircling the axis of the workpiece and evenly spaced around the azimuth of the workpiece. Two examples are the embodiments shown in FIGS. 3A and 3B having four coils 40, 42, 52, 50 spaced at 90° intervals of azimuth around the workpiece 20.

Specifically, the magnetic field can be rotated electrically by periodically shifting the correspondence between the array of coils and the different electrical currents which the DC power supplies 60, 62 supply to the respective coils. For example, suppose that during an initial time period $T_1$ the power supplies provide electrical currents $I_1$, $I_2$, $I_3$ and $I_4$ to coils 40, 42, 52 and 50, respectively. To rotate the magnetic field, during a second time period $T_2$ the power supplies would supply currents $I_2$, $I_3$, $I_4$ and $I_1$ to coils 40, 42, 52 and 50, respectively. Similarly, the respective currents supplied to the four coils would be $I_3$, $I_4$, $I_1$ and $I_2$ during a third time period $T_3$; $I_4$, $I_1$, $I_2$, and $I_3$ during a fourth time period $T_4$; and $I_1$, $I_2$, $I_3$ and $I_4$ during a fifth time period $T_5$, which is the same as the first time period $T_1$. For purposes of the discussion which follows, each such time period shall be referred to as a "rotation step".

Electrical rotation as described in the preceding paragraph is most readily implemented by connecting four independently controllable power supplies to supply current to the respective four coils. The four power supplies may be controlled by a single microcontroller 65. The four power supplies may be four independently controllable output channels of a single power supply unit. The rotation can be implemented by straightforward programming of a conventional microcontroller 65 which controls the output current of each DC power supply.

FIGS. 7A–7D depict the current waveforms that four DC power supplies would respectively apply to the four electromagnet coils 40, 42, 52, and 50 if the curved magnetic field embodiment of FIG. 3A or 3B were improved to include the rotation method described in the preceding two paragraphs. FIG. 7 shows the waveforms for R=5, I1=+4 A, I2=−4 A, I3=−0.8 A, and I4=+0.8 A.

In general, if the current flow through each of the secondary electromagnets is considered one normalized current unit, then the current flow through each of the primary electromagnets will be R current units. At the time of the transition from any one rotation step Ti to the next rotation step Ti+1, there will be four transitions 101–104 of current flow in the four respective electromagnets. Whichever electromagnet receives from its power supply +R current in step Ti will transition to −R current in step Ti+1, as represented by transition 101 in FIG. 7. Another electromagnet will undergo transition 102 from −R to −1. A third electromagnet will undergo transition 103 from −1 to +1. The fourth electromagnet will undergo transition 104 from +1 to +R. Each transition will be implemented by a controller 65 controlling the respective power supplies connected to the four electromagnet coils.

Electrical rotation is conventional in prior art magnetically-enhanced plasma systems, such as the plasma etch chamber described in the previously cited U.S. Pat. No. 5,215,619 to Cheng et al. Conventionally, the rotation frequency is about 0.5 Hz to 10 Hz.

Such slow rotation does not improve the instantaneous uniformity of ion flux spatial distribution over the workpiece 20, which is the principal performance parameter addressed by the present invention. Nevertheless, slow rotation generally is desirable to improve the long term time averaged spatial uniformity of the semiconductor fabrication process being performed on the workpiece, such as etching or deposition.

Typically, a faster rotation frequency improves time-averaged process uniformity more than a slower rotation frequency. However, the inductance of each electromagnet coil limits the extent to which the rotation frequency can be raised without incurring offsetting disadvantages due to the rise time of the current waveform through the coil. (If the power supply 60,62 is voltage regulated, the rise time of the current through any one of the coils is proportional to the coil's inductance divided by the resistance between the power supply output and the coil, including the resistance of the coil itself and the output resistance of the power supply. If the power supply 60,62 is current regulated, the rise time of the current through any one of the coils is proportional to the coil's inductance divided by the maximum voltage which the power supply 60,62 can provide to the coil.)

If the rotation frequency is so high that the duration of each "rotation step" is less than five or ten times the rise time of the coil current, two undesirable effects can result. One undesirable effect is that the time averaged current through each coil will be reduced, because of the time required for the current to ramp up to its steady state value.

A second undesirable effect is that the magnitude of the magnetic field at the plasma sheath can change during the rise time period at the beginning of each rotation step, as the current through some coils rises and the current through other coils drops. Any change in the magnetic field strength will change the ion density near the plasma sheath, which will change the total impedance of the plasma "load" to which the RF power supply 24 must supply power. The output circuit of the RF power supply generally includes an RF impedance matching network which must be adjusted to match the actual plasma load impedance. Although RF impedance matching networks can adjust automatically to changing load impedances, they typically require tens or hundreds of milliseconds to adjust to a new impedance value. Therefore, there will be a period at the beginning of each rotation step during which the output impedance of the RF power supply 24 is mismatched to the plasma load impedance. The high standing wave ratio (SWR) resulting from such an impedance mismatch can alter the RF power and voltage applied to the plasma, which can alter the plasma process in unpredictable ways or even make the plasma unstable.

The magnitude and duration of the impedance mismatch is an increasing function of the magnitude and duration of the change in magnetic field strength during the coil current rise time at the beginning of each rotation step. Increasing the rotation frequency will increase the proportion of each rotation step during which the matching network is mismatched to the plasma load impedance.

The impedance mismatch problem described in the two preceding paragraphs can be ameliorated by reducing the magnitude of the discontinuity in the magnetic field at the beginning of each rotation step. One method of accomplishing this is to use a larger number of electromagnets azimuthally spaced around the periphery of the wafer, thereby allowing the magnetic field to be rotated in proportionately smaller angular increments.

A second method of reducing the discontinuity is to change the current through each electromagnet coil at the beginning of each rotation step at a controlled rate which is slow enough to permit the RF impedance matching network to maintain a good impedance match. FIGS. 8A–8D show the current waveforms through the four electromagnets 40, 42, 52, and 50, respectively, when the waveforms of FIG. 7 are modified to provide a linear transition of the current at the beginning of each rotation step. These waveforms could be produced by straightforward programming of the controller 65. The controller programming can direct the DC power supplies 60, 62 to adjust their output currents continuously during the linear transition period, or to adjust their output currents in a number of discrete steps.

FIG. 9 shows the magnetic field at the beginning (FIG. 9A), three successive intermediate points (FIGS. 9B–D), and the end (FIG. 9E) of the linear transition from step $T_3$ to step $T_4$. FIG. 9C, showing the midpoint of the linear transition, reveals one shortcoming of this approach: the magnetic field at this point in time is linear and uniform, which is the field pattern which caused charge-up damage in prior art MERIE chambers. However, we expect the consequence of this linear magnetic field pattern to be minimal because it exists for a small fraction of the rotation period.

FIG. 10 depicts a third method we have conceived for even further reducing the discontinuity in the magnetic field during the transition between rotation steps. Specifically, FIGS. 10A–10D respectively show the current waveforms that four DC power supplies would respectively apply to the four electromagnet coils 40, 42, 52, and 50. Transitions 101 and 103, which require the current through a coil to reverse polarity, are performed more slowly (twice as slowly in the embodiment illustrated in FIG. 10) than transitions 102 and 104, which change the magnitude of the current but not the polarity. In addition, of the two fast transitions 102 and 104 which do not change the current polarity, the transition 104 which increases the current magnitude is performed earlier than the transition 102 which decreases the current magnitude. This method maintains a more constant total magnetic field strength than the methods of FIGS. 7 and 8 in which all four electromagnets' current transitions are performed simultaneously. Consequently, this method allows the RF matching network to maintain a more accurate impedance match (i.e., a lower SWR) during the transitions between rotation steps.

FIG. 11 depicts a modification of the FIG. 10 method in which each transition consists of one or two discrete substeps, rather than the transitions being linear as shown in FIG. 10. The transitions 101 and 103 which are performed slowly in the FIG. 10 method are performed in two steps in the FIG. 11 method. Specifically, transition 101 is performed in two successive substeps 101*a* and 101*b*, each substep being half the amplitude of the complete transition 101. Similarly, transition 103 is performed in two equal substeps 103*a* and 103*b*. Transitions 102 and 104, which are performed quickly in the FIG. 10 method, are each performed in one substep in the FIG. 11 method. Each such substep can be of equal duration.

FIG. 11 depicts the current waveform of each substep as having a finite slope so as to represent the risetime of the current due to the inductance of the electromagnet. This slope is not intended to represent deliberately programming the power supplies to supply linearly changing current to the coils.

The FIG. 11 method, in which each transition consists of one or two discrete substeps, is preferred to simplify programming the controller 65 which controls the power supplies which supply current to the four electromagnets. In our presently preferred implementation, each substep has a duration of 0.1 second. To rotate the magnetic field at a rotational frequency of 0.25 Hz—i.e., a rotational period of 4 seconds—the controller 65 would be programmed to increment through 40 substeps of 0.1 second each during each rotation period. In other words, each of the four rotation steps $T_1$–$T_4$ in a complete rotation cycle would consist of 10 substeps. Two of the 10 substeps would be used for the two-step transition depicted in FIG. 11, and the electromagnet current would remain constant during the remaining 8 substeps of each rotation step.

EXAMPLES

The following tests were performed in a model MxP+ etch chamber sold commercially by Applied Materials, Inc., the assignee of this patent application, similar to the chamber shown in FIG. 1. The chamber was designed to etch silicon dioxide on a single 200 mm silicon wafer 20. The chamber included four electromagnet coils 40,42,50,52 which, in combination, had the octagonal shape shown in FIG. 3B. The construction of the magnets was as described in the preceding description of FIG. 3B.

The tests were performed using a process for etching silicon dioxide. The process gas mixture was 45 sccm $CHF_3$, 15 sccm $CF_4$, and 150 sccm Ar at a total chamber pressure of 200 mT. The plasma was excited by 1000 watts of power from a 13.56 MHz RF power supply 24 connected to the cathode 22. With no magnetic field, the etch rate of the process was 3800 Å/min.

The staggered method shown in FIG. 11 for transitioning coil current between rotation steps was compared with the abrupt transition method shown in FIG. 7. The primary and secondary electromagnets received 4 A and 1 A of current, respectively, so that the magnetic field was about 30 G near the center of the wafer and R=4. The rotation frequency was 0.25 Hz. In the staggered method, each transition of electromagnet current consisted of one or two 0.1 second substeps as described above. We measured the reflected power as a function of time using a storage oscilloscope connected to a reflected power meter.

The abrupt transition method of FIG. 7 produced two reflected power peaks during each transition, each peak being about 75 watts. The total duration of the two immediately successive reflected power spikes was about 75 ms. In contrast, the staggered transition method of FIG. 11 produced two reflected power peaks of only 12 watts during each transition. The total duration of the two reflected power spikes was about 65 ms. Therefore, the staggered transition method of FIG. 11 reduced the maximum reflected power by a factor of six and slightly reduced the duration of the high reflected power condition. Consequently, the staggered transition method should enhance the stability and reliability of the semiconductor fabrication process performed in the chamber.

We also performed the following tests to assess the effect of rotation frequency on etch rate and instantaneous etch uniformity. The test conditions were the same as above, except as otherwise stated.

In one test, a DC power supply 60 supplied 4 A of current to each of two adjacent electromagnet coils as shown in FIG. 2A, thereby producing a magnetic field of about 30 G near the center of the 200 mm wafer. The magnetic field was rotated electrically by the method illustrated in FIG. 7, except that only two coils were powered at a time (i.e., 1/R=0, or R=∞), so that zero current was supplied to each coil during time periods shown in FIG. 7 as having a coil current of +/−0.8 A. In three tests performed at respective rotation frequencies of 0.25 Hz, 2.5 Hz, and 25 Hz, the respective etch rates were 13%, 10%, and 7% greater than the etch rate with zero magnetic field. These results indicate that increasing the rotation frequency from 0.25 Hz to 25 Hz reduced by one-half the improvement in etch rate afforded by the magnetic field, thereby partially defeating the purpose of the magnetic field. Furthermore, the long term time-averaged etch rate nonuniformity worsened very slightly with increasing rotation frequency. Therefore, the lowest of the three tested rotation frequencies appeared most desirable.

The preceding test was repeated with the four coil configuration of FIG. 3B with R=4, $I_1$=−$I_2$=5.3 A, $I_3$=−$I_4$=1.3 A, and a chamber pressure of 150 mT. Because the test equipment included only two DC power supplies, we could only implement the odd numbered steps $T_1$ and $T_3$ of the four step rotation method shown in FIG. 7. In other words, the rotation consisted of two 180° steps. Specifically, as shown in FIG. 3A, coils 40 and 42 were connected to one DC power supply 60, coils 50 and 52 were connected to the other DC power supply 62, and the two power supplies alternated between supplying 2×5.3 A and 2×1.3 A. At respective rotation frequencies of 0.17 Hz, 1.7 Hz, and 17 Hz, the respective etch rates were 20%, 10%, and 5% greater than the etch rate with zero magnetic field. Furthermore, the long term time-averaged etch rate nonuniformity worsened with increasing rotation frequency. Therefore, the lowest of the three tested rotation frequencies again appeared most desirable.

Notwithstanding that the preceding tests indicate that slower rotation frequencies produce better time-averaged spatial uniformity, there is a countervailing consideration that favors higher rotation frequencies. Specifically, in the integrated circuit being fabricated on the wafer, decreasing the rotation frequency will increase the time period during which the gate capacitance of each field-effect transistor in the integrated circuit will be charged up as a result of non-uniform charged particle flux from the plasma sheath to the wafer. Consequently, an excessively low rotation frequency will increase the risk of damage to the gate dielectric. Based on these countervailing considerations, our currently preferred rotation frequency is in the range of 0.25 Hz to 1.0 Hz.

8. RF Coupling Ring Encircling Wafer

In the previously described embodiments of the invention using a magnet field having counterclockwise curvature (FIGS. 2–4), we have found that the spatial uniformity over the surface of the wafer 20 of the ion flux from the plasma can be further improved by providing a narrow area surrounding the wafer through which RF power is coupled from the cathode electrode 22 to the plasma.

To maximize the rate of the plasma-enhanced semiconductor fabrication process being performed in the plasma chamber, it normally is considered desirable to minimize any coupling of RF power to the plasma from areas of the cathode electrode other than the area directly behind (i.e., covered by) the wafer 20. In other words, it normally is considered desirable to minimize coupling of RF power from the sides of the cathode or, if the cathode diameter is larger than the wafer diameter, from the portion of the upper surface of the cathode which surrounds the wafer perimeter. This concentrates as much as possible of the ion flux from the plasma sheath to the cathode electrode within the cathode surface area occupied by the wafer.

Conventionally, RF power coupling from undesired surfaces of the cathode electrode is minimized by covering those surfaces with a sufficiently thick layer of dielectric. For example, FIG. 1A shows a cylindrical dielectric shield 70 surrounding the sides of the cylindrical cathode electrode 22, and a dielectric ring 72 covering the portion of the cathode top surface which surrounds the wafer 20. In chambers for processing silicon wafers, high purity quartz is a commonly used dielectric material because the quartz will not release significant contaminants into the chamber. RF power coupling can be minimized by increasing the thickness of the dielectric and choosing dielectric material of low dielectric constant. In such a design, the area of the plasma sheath facing the cathode will be essentially the same as the area of the wafer.

We have found that the spatial uniformity of ion flux over the wafer 20 can be further improved by replacing the dielectric ring 72 (FIG. 1) with a modified dielectric ring 72' (FIG. 12) having a thinner annular portion 74 covering the cathode top surface immediately outside the perimeter of the wafer 20, and having a thick dielectric portion 76 covering the remaining top surface of the cathode. The thin, inner portion 74 of the dielectric ring should be sufficiently thin—hence, its electrical impedance at the frequency (typically 13.56 Mhz) of the RF power supply 24 should be sufficiently low—so that enough RF power is coupled from the RF power supply 24 to the plasma 80 through the inner dielectric 74 to cause the plasma sheath 82 above the wafer surface to extend radially outward over the inner dielectric 74, as shown in FIG. 12.

In the tests described below, the improved dielectric ring 72' of FIG. 12 had a thin, inner portion 74 whose radial width W was 14 mm and whose thickness or depth D was 4 mm. In contrast, the dielectric ring 72 of FIG. 1A had a thickness or depth of 8 mm at the edge of the wafer, and this thickness increased rapidly to about 15 mm beyond the perimeter of the wafer.

FIGS. 14–16 show test results demonstrating the advantage of the modified dielectric ring 72' in a process for etching a layer of silicon dioxide from a 200 mm diameter silicon wafer 20. FIGS. 14 and 15 are isometric charts generated by an interferometer showing differences in the etch rate over the surface of the wafer. The heavy black isometric lines represent the mean etch rate. Plus signs and minus signs represent areas having etch rates greater and less than the mean, respectively. The increment between each isometric line is 100 Å/min.

FIG. 16 is a table showing the mean, minimum, and maximum etch rates and the one-sigma nonuniformity of the etch rate. In the column labelled "Inner Dielectric 74", the entry "thick" means the dielectric ring 72 of FIG. 1A having a thickness or depth D of 8 mm at the edge of the wafer, and the entry "thin" means the improved dielectric ring 72' of FIG. 12 having a thickness or depth D of 4 mm at the edge of the wafer. The columns labelled "minimum" and "maximum" indicate the difference between the minimum and maximum etch rates, respectively, and the mean etch rate.

The tests were performed using the plasma chamber design of FIG. 1 and the octagonal electromagnet design of FIG. 3B. The DC power supply 60 supplied 4 A of current to each of the coils 40 and 42 in the first coil pair, so that the magnetic field strength at the center of the wafer was about 30 G. The process gas flow was 45 sccm $CHF_3$, 15 sccm $CF_4$, and 150 sccm Ar. The exhaust pump maintained the chamber pressure at 200 mT. The RF power supply 24 supplied 1000 watts of power at 13.56 MHz to the cathode. The wafers were etched for 60 seconds, resulting in about 4000 Å to 4400 Å of silicon dioxide being etched from the wafer surface.

FIG. 14 shows the test results with the DC power supply 62 supplying zero current to the coils 50 and 52 in the second coil pair (i.e., R=0), thereby producing the two-coil magnetic field pattern shown in FIG. 2A. FIG. 14A shows the results using a thick dielectric shield 72 as shown in FIG. 1, and FIG. 14B shows the results using an improved dielectric shield 72' having a thin, inner portion 74 as shown in FIG. 12. The improved dielectric shield 72' improved the etch rate spatial uniformity by increasing the etch rate in the vicinity of point P on the wafer relative to the mean, where point P is the point at which the magnetic field strength is greatest because it is the point nearest the vertex "V" of the angle between the two coils. FIG. 16 shows that both the minimum and maximum etch rates were brought closer to the mean with the improved dielectric shield 72', the worst negative deviation from the mean being reduced from –1060 to –850 Å/min., and the worst positive deviation from the mean being reduced from +1250 to +1050 Å/min.

The etch rate in the vicinity of point P is less than the mean because the counterclockwise curvature of the magnetic field causes E×B drift from point P toward point Q of charged particles in the plasma sheath and pre-sheath, leaving point P relatively depleted of charged particles. In our invention, the magnetic field strength is greatest at point P so as to offset the depleting effects of this drift. However, FIG. 14A illustrates that the gradient in magnetic field strength near point P is not quite great enough to offset the drift. FIG. 14B shows that the improved dielectric shield 72' partially ameliorates the depletion of charged particles near point P and thereby improves the etch rate uniformity.

Because the thin, inner portion 74 of the improved dielectric shield 72' extends the plasma sheath laterally outside the perimeter of the wafer as shown in FIG. 12, we theorize that the region of greatest charged particle depletion moves from point P to a point closer to the vertex V outside the perimeter of the wafer. We believe this is the reason the improved dielectric shield 72' reduces the positive and negative spatial deviations of the etch rate from the mean. However, our invention is not dependent on or limited to this theory.

FIG. 15 shows the test results with the DC power supply 62 supplying 1 A to each of the coils 50 and 52 in the second coil pair, thereby producing the four-coil magnetic field pattern shown in FIG. 3B, with R=4. FIG. 15A shows the results using a thick dielectric shield 72 as shown in FIG. 1, and FIG. 15B shows the results using an improved dielectric shield 72' having a thin, inner portion 74 as shown in FIG. 12. The improved dielectric shield 72' improved the etch rate spatial uniformity by increasing the etch rate in the vicinity of point P on the wafer relative to the mean, where point P is the point at which the magnetic field strength is greatest because it is the point nearest the vertex "V" of the angle between the two primary coils.

FIG. 16 shows that the improved dielectric shield 72' reduced the one-sigma nonuniformity of the etch rate from 6.9% to 4.9%, an improvement of approximately 30%. In addition, the deviations from the mean of both the minimum and maximum etch rates were reduced over 30%, the worst negative deviation from the mean being reduced from –1340 to –770 Å/min., and the worst positive deviation from the mean being reduced from +750 to +520 Å/min.

In the tests just described using the improved dielectric shield 72', a silicon ring 84 covers the thin portion 74 of the shield 72'. The primary purpose of the silicon ring is to protect the thin portion 74 of the shield from erosion by the silicon dioxide etch process, since the quartz shield 72' is chemically the same as the silicon dioxide being etched on the silicon wafer 20. In the etch process used in those tests, silicon etches at a rate at least ten times slower than the etch rate of quartz. When the silicon ring 84 begins to acquire a noticeably concave surface due to the etch process, the silicon ring can be readily replaced. Furthermore, the useful life of the silicon ring can be doubled by inverting it after the top surface becomes concave.

The silicon ring should be of high purity material to minimize the release of contaminants into the chamber. For maximum purity, we currently prefer the silicon ring to be single crystal silicon.

The surface of the cathode electrode 22 is anodized. The anodization layer electrically insulates the cathode from the silicon ring 84 even if the inner surface of the silicon ring touches the cathode.

We believe the dimensional parameters of the improved shield 72' which affect the spatial uniformity of the etch rate are the axial depth D of the thin, inner portion 74, the radial width W of the thin portion 74, and the height H above the wafer of the thick, outer portion 76.

The capacitive coupling of RF power between the cathode electrode 22 and the plasma 80 is proportional to the radial width W divided by the depth D of the thin, inner portion of the shield. The coupling of RF power produces a corresponding increase in charged particle concentration in the plasma pre-sheath and sheath 82 above the thin portion 74, which produces a corresponding increase in ion flux toward the thin portion 74 of the shield.

As mentioned at the beginning of this section, RF power coupled from the cathode to the plasma outside the area occupied by the wafer diminishes the concentration of ions and reactive species at the wafer surface. Therefore, whatever improvement in spatial uniformity is achieved by increased coupling of RF power through the thin portion 74 of the dielectric shield should be balanced against the resulting decrease in the average rate of the process being performed on the wafer.

The effect of the height H of the elevated, outer portion 76 is more complex. In most configurations, the predominant effect of the elevated, outer portion 76 of the shield is the "shadow" effect wherein the elevated portion 76 blocks the perimeter of the wafer from being exposed to reactive species from a full hemisphere of directions, thereby reducing the process rate near the perimeter of the wafer. However, two additional effects offset the shadow effect to some extent. Specifically, the elevated portion of the shield has a "focusing effect" which increases the ion flux near the perimeter of the wafer because ions accelerated downward from the plasma sheath collide with the elevated portion and ricochet toward the wafer. The focusing effect also is strongly dependent on the angle between the wafer surface and the face 78 of the elevated portion 76 which faces the wafer, where a 45° angle would be expected to produce the greatest deflection of ions toward the center of the wafer. The elevated portion also increases the residence time of reactive species near the perimeter of the wafer, which may either increase or decrease the process rate near the wafer perimeter, depending on the chemistry of the particular process being performed.

The shadow effect, focusing effect, and residence time effect all tend to be more pronounced as the height H is increased. All of these effects also are affected by the radial width W of the thin, inner portion 74 of the shield, because this width constitutes the spacing between the elevated portion 76 and the perimeter of the wafer. The focusing effect is expected to be maximized at a certain width W (must be empirically determined), whereas the residence time and shadow effects progressively decrease with increasing width W.

Another factor affecting the desired thickness of the improved dielectric shield 72' is whether the chamber uses an electrostatic chuck 86 (see FIG. 12) to hold the wafer 20 on the cathode electrode 22. If so, the electrostatic chuck interposes a dielectric between the cathode and the wafer, which therefore interposes a capacitive impedance between the cathode and the plasma. To maintain a given balance of RF power coupled through the wafer and through the thin, inner portion 74 of the dielectric shield, the thicknesses of both the inner portion 74 and the outer portion 76 of the dielectric shield 72' should be increased in proportion to the RF impedance of the electrostatic chuck.

In the tests described earlier, the improved shield 72' of FIG. 12 had a thin, inner portion 74 whose width W was 14 mm. Although we have not yet tested it with the curved magnetic field of the present invention, in conventional MERIE chambers we have had even better results with a similar shield characterized by a width W equal to 6 mm. Specifically, in a conventional MERIE chamber, reducing W from 14 mm to 6 mm improved the mean etch rate while retaining most of the uniformity improvement of the W=14 mm design. Therefore, we surmise that W=6 mm may be preferred in the curved magnetic field designs of the present invention.

We expect the axial depth (i.e., thickness) of the silicon ring 84 to have no substantial effect on the coupling of RF power between the cathode electrode and the plasma, and hence no substantial effect on the ion flux distribution over the wafer. In practice, the silicon ring should be thick enough to prevent accidental breakage when it is installed by maintenance personnel. Also, a thicker silicon ring can withstand more erosion before it should be replaced.

FIG. 13 shows an alternative shield design in which the silicon wafer 20 presses against, and electrically contacts, the silicon ring 84. The shield preferably includes a spring or elastomer, such the illustrated O-ring 88 having a lip seal 89, to maintain uniform pressure between the wafer 20 and the silicon ring 84. With the silicon ring electrically contacting the wafer, the silicon ring effectively becomes an extension of the wafer, and hence an extension of the cathode electrode 22. Consequently, there is no need in this design for the dielectric 76 to cover the portion of the cathode electrode beneath the silicon ring 84. The RF power coupled through the silicon ring 84 is proportional to the radial width W' of the silicon ring rather than the width W of the thin dielectric portion 74 of the FIG. 12 design. The coupled RF power also is inversely proportional to the electrical resistance of the silicon ring.

If the wafer 20 is electrically insulated from the cathode, as would be the case if the wafer is mounted to the cathode by an electrostatic chuck having a dielectric layer 86, then it is important that the silicon ring 84 also be electrically insulated from the cathode. The latter insulation may be afforded by anodizing the surface of the cathode if the cathode is aluminum. If the wafer were insulated from the cathode but the silicon ring were not, the silicon ring could be coupled to the cathode through a lower impedance than the wafer, resulting in excessive RF power being diverted through the silicon ring instead of the wafer.

The spatial uniformity of charged particle concentration is enhanced by the silicon ring 84 having a stepped upper surface. Specifically, the portion of the silicon ring which extends outside the perimeter of the wafer 20 has an upper surface which is coplanar with the upper surface of the wafer. This shape minimizes any discontinuity in the plasma sheath adjacent the perimeter of the wafer, thereby enhancing spatial uniformity of the process being performed on the wafer.

9. Other Contemplated Modifications

In its broadest sense, the present invention is defined by the direction and gradient of the magnetic field above the surface of the wafer, and it is not limited to any specific number or arrangement of the magnets which produce such magnetic field. For example, permanent magnets can be substituted for the electromagnets used in the illustrated preferred embodiments. Also, a different number of permanent magnets or electromagnets can be used to produce a magnetic field having the direction and gradient of the present invention.

In some implementations it may be impractical or undesirable to produce a magnetic field which has the desired characteristics over the entire surface of the workpiece. For example, it may be desirable to alter the magnetic field pattern near one or more edges of the workpiece to offset a nonuniformity caused by some physical or chemical phenomenon unrelated to the charged particle drift effects addressed by the present invention. An implementation remains within the scope of our invention if it produces a magnetic field whose direction and gradient satisfy the previously described requirements of the invention over the majority of the surface of the workpiece, even though the magnetic field may deviate from these requirements over a minority portion of the workpiece surface.

Another consideration is that the flux density of ions bombarding the workpiece is determined as much or more by the magnetic field in the region of the plasma sheath near the workpiece as by the magnetic field in the region occupied by the workpiece itself. Therefore, an alternative definition of our invention is a magnetically enhanced plasma chamber in which the previously defined orientation of the magnetic field gradient exists at a planar region above the workpiece area, where the planar region is parallel to the workpiece area and has a surface area which is at least half of—preferably close to 100% of—the surface area of the workpiece.

All references in the specification and claims to directions such as "upper", "lower", "above", and "below" are intended merely to indicate the locations of components relative to each other, and not to indicate the orientation of the components relative to the direction of gravity. The direction of the earth's gravity is irrelevant to this invention. For example, the illustrated designs can be inverted for face down processing of semiconductor wafers, in which case directions described in this patent specification and claims as "upper" and "lower" would actually be "down" and "up", respectively, relative to the direction of the earth's gravity.

What is claimed is:

1. A magnetically-enhanced plasma chamber for producing an improved instantaneous spatial uniformity of ion flux from the plasma to a semiconductor workpiece, comprising:
   a chuck for holding a flat semiconductor workpiece so that the workpiece occupies a workpiece area;
   a plasma source for producing a plasma in a first region above the workpiece area; and
   a magnet configured to produce in a planar second region a magnetic field having a non-zero gradient such that, at every point in the second region, the magnetic field at that point has a direction that is approximately the vector cross product of (i) the gradient of the magnitude of the magnetic field at that point, and (ii) a vector extending perpendicularly from the workpiece area toward the plasma;
   wherein the second region is parallel to and adjacent to the workpiece area and has a surface area substantially greater than half of the workpiece area;
   wherein, at every instant, the magnetic field has a range of magnitudes in the second region which ranges between a minimum magnitude and a maximum magnitude, wherein the minimum magnitude occurs at only a single point; and
   wherein, at every instant, the magnetic field has a clockwise curvature relative to said single point when viewed from above the workpiece area.

2. A chamber according to claim 1, wherein:
   the workpiece area is bounded by a perimeter; and
   the single point is located near the perimeter of the workpiece area.

3. A chamber according to claim 2, wherein the location of the single point revolves around the perimeter of the workpiece area over time.

4. A chamber according to claim 1, wherein the second region is coincident with the workpiece area.

5. A chamber according to claim 1, further comprising:
   an electrical controller circuit for electrically adjusting the gradient of the magnetic field.

6. A chamber according to claim 5, wherein:
   the chamber further comprises an electrical power supply;
   the magnet comprises an electromagnet connected to receive electrical current from the power supply; and
   the electrical controller circuit adjusts the amount of electrical current which the power supply provides to the electromagnet.

7. A magnetically-enhanced plasma chamber for producing an improved instantaneous spatial uniformity of ion flux from the plasma to a semiconductor workpiece, comprising:
   a chuck for holding a semiconductor workpiece so that the workpiece occupies a workpiece area bounded by a perimeter;
   a plasma source for producing a plasma in a region above the workpiece area;
   a unitary magnet having a north magnetic pole and a south magnetic pole located at distinct azimuths around the perimeter of the workpiece area, wherein
      each magnetic pole faces a direction which is more toward than away from the center of the workpiece area, and
      the azimuth of the north magnetic pole minus the azimuth of the south magnetic pole is substantially greater than zero and substantially less than 180° degrees in a direction counterclockwise around said perimeter when viewing the workpiece area from above.

8. A chamber according to claim 7, wherein the north magnetic pole and south magnetic pole have respective magnetic axes which are mutually perpendicular.

9. A magnetically-enhanced plasma chamber for producing an improved instantaneous spatial uniformity of ion flux from the plasma to a semiconductor workpiece, comprising:
   a chuck for holding a semiconductor workpiece so that the workpiece occupies a workpiece area bounded by a perimeter;
   a plasma source for producing a plasma in a region above the workpiece area; and
   a first north magnetic pole, a first south magnetic pole, a second south magnetic pole, and a second north magnetic pole positioned at respective azimuths around the perimeter of the workpiece area which are progressively clockwise around the perimeter of the workpiece area when viewing the workpiece area from above, wherein each magnetic pole faces a direction which is more toward than away from the center of the workpiece area, and the first north magnetic pole and first south magnetic pole in combination produce a first magnetic field between them, the second north magnetic pole and second south magnetic pole in combination produce a second magnetic field between them, and the four magnetic poles are configured so that the first magnetic field is substantially stronger than the second magnetic field.

10. A chamber according to claim 9, wherein:

the first north magnetic pole and first south magnetic pole are the north and south poles, respectively, of a first magnet, and the second north magnetic pole and second south magnetic pole are the north and south poles, respectively, of a second magnet.

11. A chamber according to claim 10, further comprising:

means for adjusting the ratio between the strength of the magnetic field produced by the first magnet and the strength of the magnetic field produced by the second magnet.

12. A chamber according to claim 11, wherein:

the chamber further comprises an electrical power supply;

one of the first and second magnets includes an electromagnet connected to receive electrical current from the power supply; and the means for adjusting said magnetic field strength ratio includes a controller circuit for adjusting the current provided by the power supply to the electromagnet.

13. A chamber according to claim 11, wherein:

the first and second magnets respectively include first and second electromagnets; and the means for adjusting said magnetic field strength ratio comprises an electrical power supply for providing electrical current to the first and second electromagnets, the power supply being adjustable for adjusting the ratio between the current the power supply provides to the first electromagnet and the current the power supply provides to the second electromagnet.

14. A chamber according to claim 9, wherein the first and second north magnetic poles and the first and second south magnetic poles are four distinct electromagnets.

15. A chamber according to claim 14, wherein:

the means for adjusting said magnetic field strength ratio comprises an electrical power supply for providing electrical current to the four electromagnets;

the power supply provides a first amount of current to both the first north electromagnet and the first south electromagnet;

the power supply provides a second amount of current to both the second north electromagnet and the second south electromagnet; and the power supply is adjustable for adjusting the ratio between the first and second amounts of current.

16. A chamber according to claim 9, wherein:

the first north magnetic pole and the second south magnetic pole have respective magnetic axes which are parallel; and the second north magnetic pole and the first south magnetic pole have respective magnetic axes which are perpendicular to the magnetic axes of the first north magnetic pole and the second south magnetic pole.

17. A chamber according to claim 9, further comprising:

a plurality of electromagnets at successively spaced positions around the periphery of the workpiece area; and a power supply for providing electrical current to the electromagnets, wherein the power supply provides different current signals to different ones of the electromagnets so as to produce said north and south magnetic poles, and the power supply provides each of said different current signals to each of the electromagnets in succession so that the electromagnets produce a rotating magnetic field.

18. A chamber according to claim 9, further comprising:

means for adjusting the ratio between the strength of the first magnetic field and the strength of the second magnetic field.

19. A chamber according to claim 9, wherein:

the first north magnetic pole and the first south magnetic pole are positioned at one side of a geometric line bisecting the workpiece area; and the second north magnetic pole and the second south magnetic pole are positioned at the opposite side of said geometric line bisecting the workpiece area.

20. A chamber according to claim 9, further comprising:

a plurality of electromagnets, wherein the plurality of electromagnets includes at least a first, a second, a third, and a fourth electromagnet at successively spaced positions around the periphery of the workpiece area; and a power supply for providing electrical current to the electromagnets, wherein the power supply provides a first current to at least the first and second electromagnets so as to produce said first north magnetic pole and said first south magnetic pole, and the power supply provides a second current to at least the third and fourth electromagnets so as to produce said second south magnetic pole and said second north magnetic pole, wherein the second current is substantially less than the first current.

21. A chamber according to claim 9, further comprising:

at least four electromagnets at successively spaced positions around the periphery of the workpiece area; and a power supply for simultaneously providing a first current and a second current to the electromagnets, wherein the power supply provides the first current to at least two of the electromagnets so as to produce said first north magnetic pole and said first south magnetic pole, and the power supply provides the second current to at least two of the electromagnets other than the two to which it provides the first current, wherein the second current is substantially less than the first current, so as to produce said second south magnetic pole and said second north magnetic pole;

wherein the power supply provides the first and second currents to successively positioned electromagnets at successive times so that the electromagnets collectively produce a magnetic field that rotates over time.

22. A magnetically enhanced plasma chamber for processing a semiconductor workpiece, comprising:

a workpiece support for holding the workpiece at a workpiece support area;

a plurality of electromagnets at positions spaced around the periphery of the workpiece support area; and a power supply for providing to each respective electromagnet a respective current signal having successive fixed current values during successive time intervals so that the electromagnets in combination produce a magnetic field which rotates over time, wherein each of said time intervals is separated by a transition time period during which the power supply is configured to change the value of the current it provides to the respective electromagnets, during each transition period, to those electromagnets to which the power supply provides a current change which is a change in magnitude of current with unchanged polarity, the power supply is configured to provide said current change during a short portion of the transition period, during each transition period, to those electromagnets to which the power supply provides a current change which includes a polarity reversal, the power supply is configured to provide said current change during a long portion of the transition period, and each long portion of a transition period has a duration substantially longer than each short portion of the transition period.

23. A chamber according to claim 22, wherein:

each long portion of a transition period has a duration substantially equal to the transition period, and each short portion of a transition period has a duration substantially equal to one-half the transition period.

24. A chamber according to claim 22, wherein:

during each transition period, to those electromagnets to which the power supply provides a current change which is an increase in magnitude of current with unchanged polarity, the power supply provides said current change during an initial segment of the transition period; and during each transition period, to those electromagnets to which the power supply provides a current change which is a decrease in magnitude of current with unchanged polarity, the power supply provides said current change during an ending segment of the transition period.

25. A method of producing an ion flux from a plasma to the surface of a semiconductor workpiece, comprising the steps of:

holding a semiconductor workpiece having a flat surface;

producing a plasma in a region above the surface of the workpiece; and producing a magnetic field in a planar region such that, at any point in the planar region, the direction of the magnetic field at that point is approximately the vector cross product of (i) the gradient of the magnitude of the magnetic field at that point, and (ii) a vector extending perpendicularly from the workpiece surface toward the plasma;

wherein the planar region is parallel to and adjacent to the workpiece surface and has a surface area which is at least half the surface area of the workpiece surface;

wherein, at every instant, the magnetic field has a range of magnitudes in the second region which ranges between a minimum magnitude and a maximum magnitude, wherein the minimum magnitude occurs at only a single point; and wherein, at every instant, the magnetic field has a clockwise curvature relative to said single point when viewed from above the workpiece area.

26. A method of producing an ion flux from a plasma to a semiconductor workpiece, comprising the steps of:

holding a semiconductor workpiece having a surface bounded by a perimeter;

producing a plasma in a region above the surface of the workpiece;

providing a unitary magnet having a north magnetic pole and a south magnetic pole; and positioning the magnet so as to position the north magnetic pole and south magnetic pole at distinct azimuths around the perimeter of the workpiece surface, wherein each magnetic pole faces a direction which is more toward than away from the center of the workpiece surface, and the azimuth of the north magnetic pole minus the azimuth of the south magnetic pole is substantially greater than zero and substantially less than 180° degrees in a direction counterclockwise around said perimeter when viewing the workpiece area from above.

27. A method of producing an ion flux from a plasma to a semiconductor workpiece, comprising the steps of:

holding a semiconductor workpiece having a surface bounded by a perimeter;

producing a plasma in a region above the surface of the workpiece; and positioning a first north magnetic pole, a first south magnetic pole, a second south magnetic pole, and a second north magnetic pole at respective azimuths around the perimeter of the workpiece surface which are progressively clockwise around the perimeter of the workpiece surface when viewing the workpiece surface from above, wherein each magnetic pole faces a direction which is more toward than away from the center of the workpiece surface, and the first north magnetic pole and first south magnetic pole in combination produce a first magnetic field between them, the second north magnetic pole and second south magnetic pole in combination produce a second magnetic field between them, and the first magnetic field is substantially stronger than the second magnetic field.

28. A method according to claim 27, further comprising the step of:

adjusting the ratio between the strength of the first magnetic field and the strength of the second magnetic field.

29. A method according to claim 27, wherein:

the step of positioning the first north magnetic pole and first south magnetic pole comprises the step of providing a first magnet having said first north pole and said first south pole; and the step of positioning the second north magnetic pole and second south magnetic pole comprises the step of providing a second magnet having said second north pole and said second south pole.

30. A method according to claim 29, further comprising the step of:

adjusting the ratio between the strength of the magnetic field produced by the first magnet and the strength of the magnetic field produced by the second magnet.

31. A method according to claim 30, further comprising the steps of:

providing an electromagnet as one of the first and second magnets; and supplying electrical current to the electromagnet;

wherein the step of adjusting said ratio comprises adjusting the amount of said electrical current supplied to the electromagnet.

32. A method according to claim 30, further comprising the steps of:

providing first and second electromagnets as said first and second magnets, respectively; and supplying first and second electrical currents to the first and second electromagnets, respectively;

wherein the step of adjusting said ratio comprises adjusting the ratio between the first electrical current and the second electrical current.

33. A method according to claim 27, wherein the step of positioning the magnetic poles comprises the step of:

positioning four distinct electromagnets at the respective positions of the first north magnetic pole, first south magnetic pole, second north magnetic pole, and second south magnetic pole.

34. A method according to claim 33, further comprising the steps of:

supplying a first amount of electrical current to the first north electromagnet and the first south electromagnet;

supplying a second amount of electrical current to the second north electromagnet and the second south electromagnet; and adjusting the ratio between the first amount of current and the second amount of current.

35. A method according to claim 27, wherein the step of positioning the magnetic poles further comprises the steps of:

orienting the first north magnetic pole and the second south magnetic pole so that their respective magnetic axes are parallel; and orienting the second north magnetic pole and the first south magnetic pole so that their respective magnetic axes are perpendicular to the magnetic axes of the first north magnetic pole and the second south magnetic pole.

36. A method according to claim 27, further comprising the steps of:

positioning a plurality of electromagnets at successively spaced positions around the periphery of the workpiece surface;

supplying different electrical current signals to different ones of the electromagnets so as to produce said north and south magnetic poles; and supplying each of said different electrical current signals to each of the electromagnets in succession so that the electromagnets produce a rotating magnetic field.

37. A method of claim 27, wherein the step of positioning the magnetic poles comprises the steps of:

positioning the first north magnetic pole and the first south magnetic pole at one side of a geometric line bisecting the workpiece surface; and positioning the second north magnetic pole and the second south magnetic pole at the opposite side of said geometric line bisecting the workpiece surface.

38. A method according to claim 27, further comprising the steps of:

providing a plurality of electromagnets, wherein the plurality of electromagnets includes at least a first, a second, a third, and a fourth electromagnet at successively spaced positions around the periphery of the workpiece area;

supplying a first current to at least the first and second electromagnets so as to produce said first north magnetic pole and said first south magnetic pole; and supplying a second current to at least the third and fourth electromagnets so as to produce said second south magnetic pole and said second north magnetic pole, wherein the second current is substantially less than the first current.

39. A method according to claim 27, further comprising the steps of:

positioning at least four electromagnets at successively spaced positions around the periphery of the workpiece area; and simultaneously supplying a first current and a second current to the electromagnets, wherein the step of simultaneously supplying the first and second currents comprises the steps of supplying the first current to at least two of the electromagnets so as to produce said first north magnetic pole and said furst south magnetic pole, supplying the second current to at least two of the electromagnets other than the two to which the first current is supplied, wherein the second current is substantially less than the first current, so as to produce said second south magnetic pole and said second north magnetic pole, and supplying the first and second currents to successively positioned electromagnets at successive times so that the electromagnets collectively produce a magnetic field that rotates over time.

40. A method of magnetically enhancing a plasma process performed on a semiconductor workpiece, comprising the steps of:

holding a semiconductor workpiece at a workpiece support area bounded by a perimeter;

positioning a plurality of electromagnets at positions spaced around the perimeter of the workpiece support area; and supplying to each respective electromagnet a respective electrical current signal having successive fixed current values during successive time intervals so that the electromagnets in combination produce a magnetic field which rotates over time, wherein each of said time intervals is separated by a transition time period during which the respective values of the current supplied to the respective electromagnets are changed, and wherein the supplying step includes the steps of during each transition period, to those electromagnets to which the change in supplied current is a change in magnitude of current with unchanged polarity, supplying said current change during a short portion of the transition period, and during each transition period, to those electromagnets to which the change in supplied current includes a polarity reversal, supplying said current change during a long portion of the transition period, wherein each long portion of a transition period has a duration substantially longer than each short portion of the transition period.

41. A method according to claim 40, wherein:

each long portion of a transition period has a duration substantially equal to the transition period, and each short portion of a transition period has a duration substantially equal to one-half the transition period.

42. A method according to claim 40, wherein the supplying step comprises the steps of:
  during each transition period, to those electromagnets to which the change in supplied current is an increase in magnitude of current with unchanged polarity, supplying said current change during an initial segment of the transition period; and
  during each transition period, to those electromagnets to which the change in supplied current is a decrease in magnitude of current with unchanged polarity, supplying said current change during an ending segment of the transition period.

* * * * *